(12) United States Patent
Clark

(10) Patent No.: US 11,626,526 B2
(45) Date of Patent: Apr. 11, 2023

(54) 3D PRINTED THREE-DIMENSIONAL PHOTOVOLTAIC MODULE

(71) Applicant: Daniel S. Clark, Orangevale, CA (US)

(72) Inventor: Daniel S. Clark, Orangevale, CA (US)

( * ) Notice: Subject to any disclaimer, the term of this patent is extended or adjusted under 35 U.S.C. 154(b) by 0 days.

(21) Appl. No.: 15/900,779

(22) Filed: Feb. 20, 2018

(65) Prior Publication Data

US 2018/0240923 A1 Aug. 23, 2018

Related U.S. Application Data

(63) Continuation-in-part of application No. 14/835,578, filed on Aug. 25, 2015, now Pat. No. 9,899,956.

(60) Provisional application No. 62/041,480, filed on Aug. 25, 2014, provisional application No. 62/130,397, filed on Mar. 9, 2015, provisional application No. 62/132,256, filed on Mar. 12, 2015.

(51) Int. Cl.
*H02S 30/10* (2014.01)
*H02S 40/22* (2014.01)
*H01L 31/043* (2014.01)
*H01L 31/054* (2014.01)
*H01L 31/042* (2014.01)
*B33Y 80/00* (2015.01)

(52) U.S. Cl.
CPC .......... *H01L 31/043* (2014.12); *H01L 31/042* (2013.01); *H01L 31/0543* (2014.12); *H01L 31/0547* (2014.12); *H02S 30/10* (2014.12); *H02S 40/22* (2014.12); *B33Y 80/00* (2014.12); *Y02E 10/52* (2013.01)

(58) Field of Classification Search
CPC .................. H01L 31/00–078; Y02E 10/50–60
USPC .................................................. 136/243–265
See application file for complete search history.

(56) References Cited

U.S. PATENT DOCUMENTS

| 4,687,880 A * | 8/1987 | Morris ................ H01L 31/0547 |
| | | 136/246 |
| 5,427,628 A | 6/1995 | Hartley |
| 5,745,197 A | 4/1998 | Leung et al. |
| 5,981,865 A | 11/1999 | La Vecchia |
| 2005/0133082 A1* | 6/2005 | Konold ................... H02S 40/44 |
| | | 136/246 |
| 2007/0240758 A1 | 10/2007 | Spartz |
| 2009/0078249 A1 | 3/2009 | Liu |
| 2009/0107545 A1 | 4/2009 | Moslehi |

(Continued)

FOREIGN PATENT DOCUMENTS

JP 2011114091 * 6/2011

OTHER PUBLICATIONS

JP2011114091 English translation (Year: 2011).*

(Continued)

*Primary Examiner* — Bach T Dinh
(74) *Attorney, Agent, or Firm* — The Roy Gross Law Firm, LLC; Roy Gross

(57) ABSTRACT

A 3D printed three-dimensional photovoltaic system that allows for the absorption of solar energy from various angles. The solar structure has a plurality of solar cells in a substantially flat 3D polygon solar frame or substantially flat mountainous 3D solar frame having an uneven surface and a reflective surface positioned underneath the solar frame to reflect light. The plurality of solar cells are oriented at various angles with respect to said reflective surface. The plurality of solar cells are configured to receive sunlight.

15 Claims, 24 Drawing Sheets

(56) References Cited

U.S. PATENT DOCUMENTS

| | | |
|---|---|---|
| 2011/0070765 A1* | 3/2011 | Kobayashi .............. H02S 20/23 |
| | | 439/387 |
| 2011/0146752 A1 | 6/2011 | Park |
| 2013/0192662 A1* | 8/2013 | Snidow ................ H01L 31/042 |
| | | 136/246 |
| 2013/0340824 A1* | 12/2013 | Oh .................... H01L 31/02168 |
| | | 136/256 |
| 2014/0224321 A1 | 8/2014 | Lim |
| 2014/0259899 A1 | 9/2014 | Poivet |
| 2015/0295109 A1* | 10/2015 | Nobori .................... H02S 30/10 |
| | | 136/246 |
| 2016/0056316 A1* | 2/2016 | Clark .................... H01L 31/042 |
| | | 136/246 |
| 2016/0149537 A1* | 5/2016 | Ott .......................... H02S 20/00 |
| | | 136/251 |
| 2017/0294872 A1 | 10/2017 | Jacques |

OTHER PUBLICATIONS

International Search Report, PCT/US2019/018430, Completed May 30, 2019; dated Jun. 20, 2019, 2 pages.
Written Opinion of the International Searching Authority, PCT/US2019/018430, dated Jun. 20, 2019, 4 pages.

* cited by examiner

Triangle

Square

Rectangle

Pentagon

Hexagon

Heptagon

Octagon

Decagon

3D PRINTED THREE-DIMENSIONAL PHOTOVOLTAIC MODULE

CROSS REFERENCE TO RELATED APPLICATIONS

This application is a continuation-in-part application to U.S. patent Ser. No. 14/835,578 filed Aug. 25, 2017, issued as U.S. Pat. No. 9,899,956, which claims priority to U.S. Provisional Patent application Ser. No. 62/041,480 filed on Aug. 25, 2014, U.S. Provisional Patent application Ser. No. 62/130,397 filed on Mar. 9, 2015, and U.S. Provisional Patent application Ser. No. 62/132,256 filed on Mar. 12, 2015. The contents of the above referenced applications are incorporated by reference into this application in their entirety.

FIELD OF THE INVENTION

The present invention relates generally to solar energy devices. More specifically, the present invention is a three-dimensional photovoltaic module having a plurality of solar cells configured in a flat polygon arrangement, flat mountainous polygon or a polyhedron arrangement, wherein each of the plurality of solar cells absorbs light from a different angle. The present invention relates to 3D printed solar energy and to a 3D printed solar frame that is configured to hold a plurality of solar cells.

BACKGROUND OF THE INVENTION

The sun is the ultimate source of energy, which provides the earth with enough solar energy, such that a mere fraction of the solar energy if efficiently converted into electrical energy will be enough for all human needs. Solar energy becomes more and more efficient, with its low pollution and is one of the unlimited renewable energy resources. It provides an efficient alternative to fossil fuels and also a promising long term solution to solving the energy crisis.

Solar technologies are broadly characterized as either passive solar technology or active solar technology depending on the way they capture, convert and distribute solar energy. Active solar techniques include the use of photovoltaic panels to harness the energy. The light-harvesting process to convert solar energy to electricity comprises two key steps that determine the overall efficiency of the process, namely i) light absorption, and ii) charge collection. The solar panels, or photovoltaic cells, industry is growing at a high pace with a vast market potential.

Two-dimensional flat solar panels are the commonly used panels for solar energy harvesting, these panels being found installed on the roofs of both domestic and commercial properties. But the two-dimensional panel poses certain limitations such as insufficient energy conversion due to the relative lack of direct incident light, especially in high altitude regions. Light at non-normal angles of incidence impacts the efficiency of the flat solar panel, and this is especially apparent not only when considering the sun's movement during its daily cycle, but also the sun's movement during its yearly cycle.

Conventional solar panels comprise lots of small solar cells spread over a large area that can work together to provide enough power thus consuming vast space rendering it difficult to install such solar panels in a variety of commercial setups. In addition to space constraints, reflectivity of the solar cell surface also significantly impairs productivity of the solar panel despite the existing anti-reflectivity coating techniques to overcome reflectivity issues. In addition to space constraints and two-dimensional flat panel design, solar panels known in the art pose further limitations due to employment of conventional metallic contact wires and bus bars inside the solar cells.

SUMMARY OF INVENTION

Therefore, there exists a need in the art for an efficient solar panel design in order to maximize the conversion of sunlight into electricity. It is an object of the present invention to provide a three-dimensional photovoltaic module that allows for the absorption of solar energy from various angles in a three hundred sixty-degree arrangement. The present invention includes a solar structure having a plurality of solar cells that are positioned about a solar frame in a polyhedron arrangement. Each of the plurality of solar cells is two-sided, wherein each of the plurality of solar cells absorbs light from the exterior of the solar structure and from an interior volume of the solar structure. A concentrated photovoltaic lens directs light into and traps light within the interior volume.

The solar structure is connected to a base panel unit that allows the solar structure to freely rotate in order to cool the solar structure and increase the efficiency of the present invention. The solar structure is connected to a rotational base of the base panel unit, wherein the rotational base is magnetically levitated about a magnetic base that allows for the rotation of the solar structure. Furthermore, a plurality of acoustic levitation modules stabilizes the levitation of the rotational base about the magnetic base. A module support structure is also provided to allow for the optimal positioning of multiple three-dimensional photovoltaic modules.

In other embodiments of the invention, a 3D printed three-dimensional solar photovoltaic system is provided including solar structure including a substantially flat 3D polygon solar frame having an uneven surface, and a plurality of solar cells positioned with the substantially flat solar frame; a reflective surface positioned underneath the solar frame, the reflective surface configured to reflect sunlight, wherein the plurality of solar cells are oriented at various angles with respect to said reflective surface, wherein said plurality of solar cells are configured to receive sunlight.

In certain embodiments, the solar frame is manufactured via a 3D printer.

In certain embodiments, the plurality of solar cells are manufactured via a 3D printer. In certain embodiments, the entire system is manufactured via a 3D printer.

In certain embodiments, the plurality of solar cells are configured to receive sunlight from the top and bottom of the photovoltaic system.

In certain embodiments, the solar frame is transparent.

In certain embodiments, the plurality of solar cells are two-sided such that the plurality of solar cells are configured to receive sunlight both directly from the sun and from said reflective surface.

In certain embodiments, the plurality of solar cells are faced back-to-back can be absorbed from the top and bottom of design.

In certain embodiments, the solar frame is a lattice.

In certain embodiments, sunlight is configured to pass through the lattice structure of the solar frame.

In certain embodiments, the reflective surface is selected from a group consisting of a mirror, glass beads, reflective paint, ceramic beads, microcrystalline ceramic beads, and diamond-studded plate, and combinations thereof.

In certain embodiments, each of the plurality of solar cells comprises a first photovoltaic cell.

In certain embodiments, the first photovoltaic cell comprises a plurality of nanoscale pores and an absorption wafer; and the plurality of nanoscale pores traversing into the absorption wafer.

In certain embodiments, the first photovoltaic cell comprises an absorption wafer, a contact layer, and a subsequent contact; and wherein the subsequent contact being positioned on the absorption wafer opposite the contact layer.

In certain embodiments, each of the plurality of solar cells are perimetrically connected to the solar frame.

In certain embodiments, the system includes a concentrated photovoltaic lens having a pentagonal shape located within the solar frame.

In certain embodiments, the plurality of solar cells form a polyhedron arrangement.

In certain embodiments, the plurality of solar cells are triangular, pentagonal or are 3D polygons.

In certain embodiments, the plurality of solar cells can have various shapes and configurations that is adapted to the solar frame.

In certain embodiments, the substantially flat 3D polygon solar frame is made of a plastic or polymer material.

In certain embodiments, the substantially flat 3D polygon solar frame is made of a plurality of sections having a pentagonal configuration.

Other objects of the invention are achieved by providing a three-dimensional solar photovoltaic system including a solar structure including a substantially flat solar frame having an uneven surface, and a plurality of solar cells positioned with the substantially flat solar frame (for example as shown in FIG. 18); a reflective surface positioned underneath the solar frame, the reflective surface configured to reflect sunlight, wherein the plurality of solar cells are oriented at various angles with respect to said reflective surface, wherein said plurality of solar cells are configured to receive sunlight.

DETAIL DESCRIPTION OF THE INVENTION

All illustrations of the drawings are for the purpose of describing selected versions of the present invention and are not intended to limit the scope of the present invention.

The present invention is a three-dimensional photovoltaic module that allows for the absorption of solar energy from various angles in a three hundred sixty-degree arrangement. In reference to FIG. 1, the three-dimensional photovoltaic module comprises a base panel unit 1, a solar structure 2, a module support structure 4, and a plurality of acoustic levitation modules 3. The solar structure 2 provides the components for absorbing light and converting the said light to electrical current. The solar structure 2 is supported by the base panel unit 1, which is in turn supported by the module support structure 4. The plurality of acoustic levitation modules 3 assist in stabilizing the solar structure 2 and the base panel unit 1.

Figure 3:
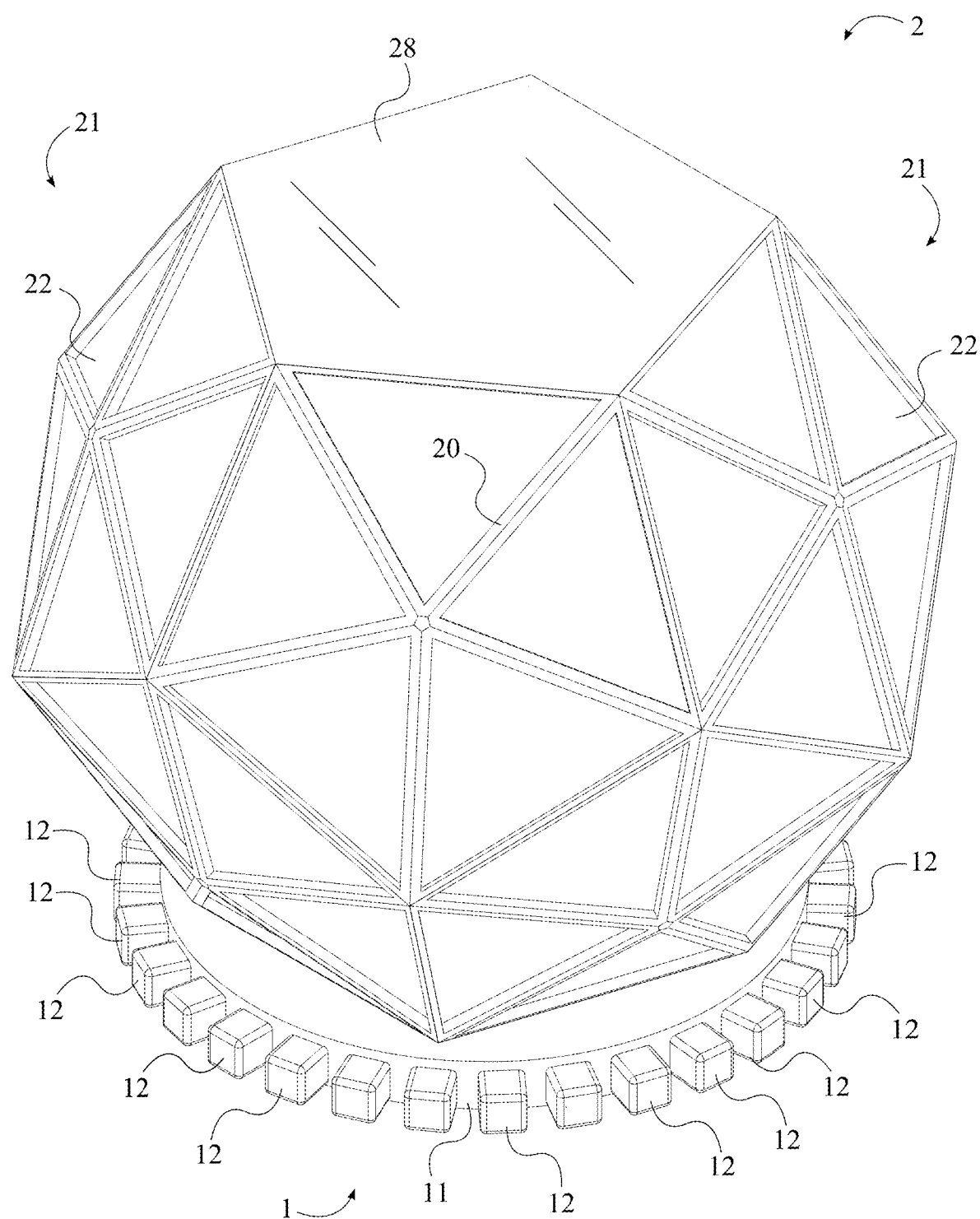
FIG. 3 is a perspective view of the solar structure connected to the rotational base, wherein the concentrated photovoltaic lens is in place.
Figure 4:
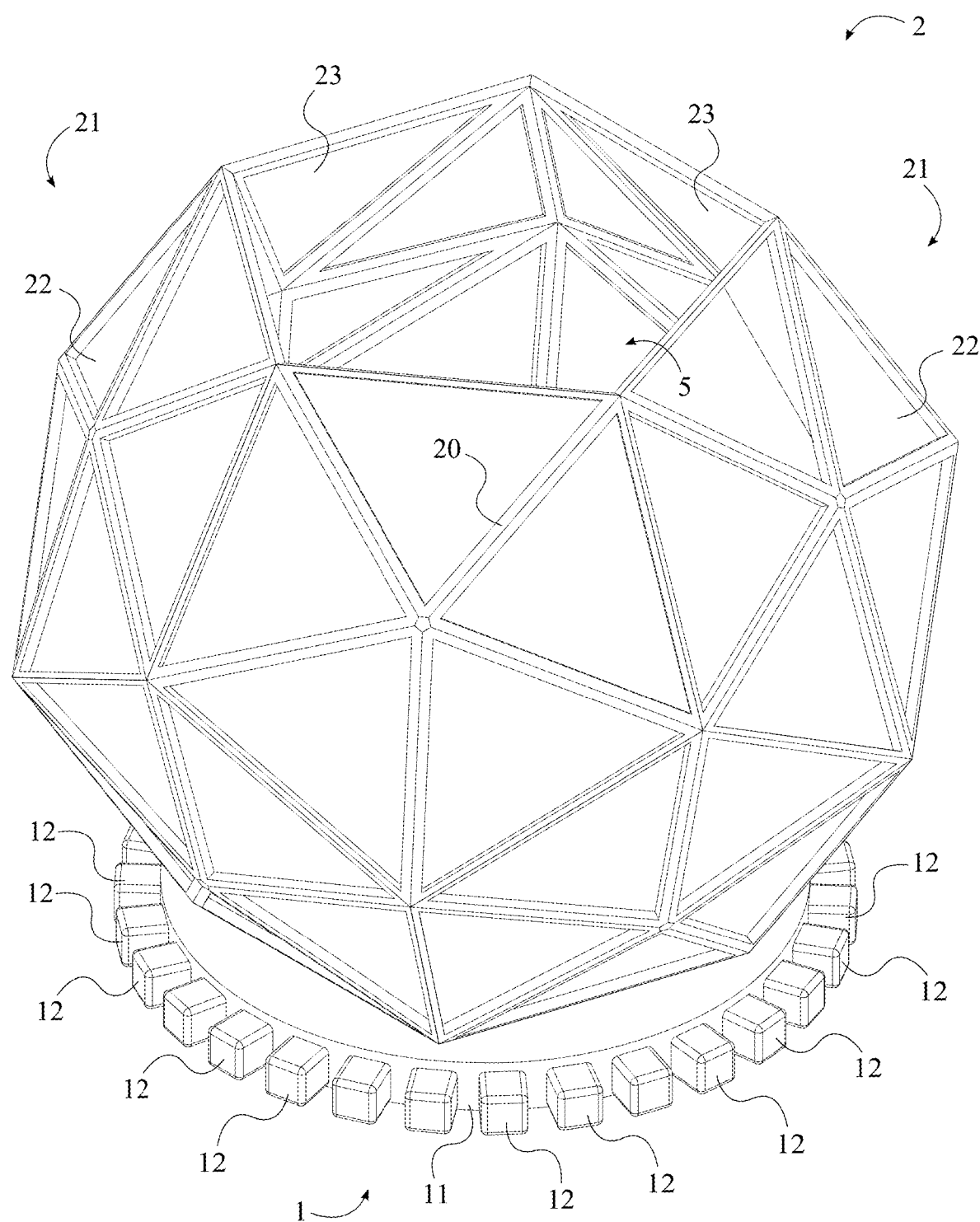
FIG. 4 is a perspective view of the solar structure connected to the rotational base, wherein the concentrated photovoltaic lens is removed.

In reference to FIG. 3-4, the solar structure 2 is adjacently connected to the base panel unit 1 and comprises a solar frame 20, a plurality of solar cells 21, and a concentrated photovoltaic lens 28. The solar frame 20 supports the plurality of solar cells 21 and defines the overall shape of the solar structure 2. The solar frame 20 is a framework that delineates a plurality of open spaces into which the plurality of solar cells 21 is positioned. Each of the plurality of solar cells 21 is perimetrically connected to the solar frame 20, wherein the plurality of solar cells 21 is distributed in a polyhedron arrangement. In the preferred embodiment of the present invention, each of the plurality of solar cells 21 is triangular, however, it is possible for the plurality of solar cells 21 to be differently shaped in other embodiments of the present invention.

In reference to FIG. 3, similar to each of the plurality of solar cells 21, the concentrated photovoltaic lens 28 is perimetrically connected to the solar frame 20. The concentrated photovoltaic lens 28 is positioned about the solar frame 20 opposite the base panel unit 1, wherein the concentrated photovoltaic lens 28 is positioned about the top of the solar frame 20. Together the solar structure 2 and the base panel unit 1 delineate an interior volume 5 as depicted in FIG. 4, wherein the concentrated photovoltaic lens 28 allows light to travel through the solar structure 2 into the interior volume 5. The concentrated photovoltaic lens 28 focuses the light and traps the light within the interior volume 5. In the preferred embodiment of the present invention, the concentrated photovoltaic lens 28 is a Fresnel lens, however, other types of lenses may be used in other embodiments of the present invention. Furthermore, in the preferred embodiment of the present invention, the solar frame 20 is transparent, wherein light is able to pass through the solar frame 20 into the interior volume 5.

Each of the plurality of solar cells 21 is designed to absorb light from two sides, wherein each of the plurality of solar cells 21 comprises a first photovoltaic cell 22. In the preferred embodiment of the present invention, the first photovoltaic cell 22 is designed to absorb light through two opposing sides. In this way, the first photovoltaic cell 22 is able to absorb sun light from the exterior of the solar structure 2, as well as sun light from the interior volume 5 that is distributed through the concentrated photovoltaic lens 28.

Figure 6:
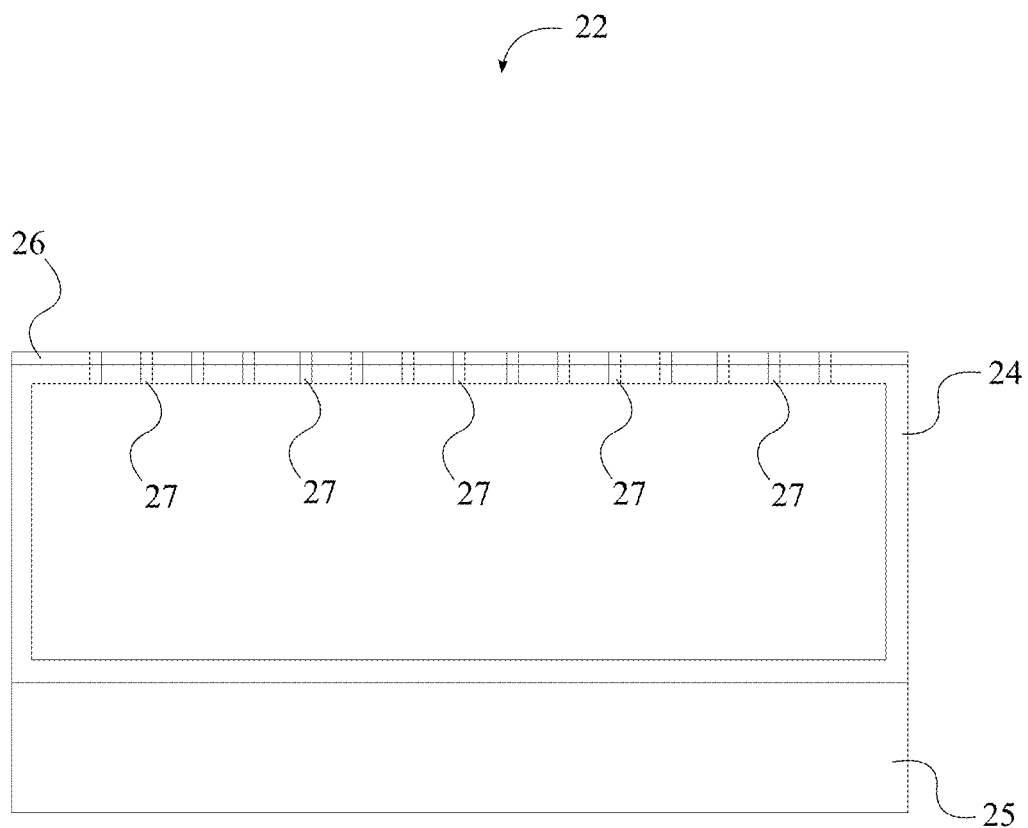
FIG. 6 is a sectional view of the first photovoltaic cell for each of the plurality of solar cells.

In reference to FIG. 6, the first photovoltaic cell 22 comprises an absorption wafer 24, a contact layer 25, and a subsequent contact 26. The absorption wafer 24 is a semiconductor that absorbs light energy and provides a p-n junction to generate an electric current. The absorption wafer 24 can provide a single-junction or multi junctions depending on the embodiment and desired usage of the present invention. In the preferred embodiment of the present invention, the absorption wafer 24 is a crystalline silicone that provides a single-junction, however, in other embodiments of the present invention, the absorption wafer 24 may also be a thin film technology, multiple thin film technologies forming a multi-junction, or other photovoltaic material.

In further reference to FIG. 6, the subsequent contact 26 is positioned on the absorption wafer 24 opposite the contact layer 25, wherein the subsequent contact 26 completes a circuit with the contact layer 25. In the preferred embodiment 5 of the present invention, the subsequent contact 26 is a plurality of nanomaterials that includes copper nanowire, liquid metallic carbon nanotubes, and other nanoparticles. The plurality of nanomaterials acts to further increase the absorption of light and thus increase the overall efficiency of each of the plurality of solar cells 21. In the preferred embodiment of the present invention, the plurality of nanomaterials is applied to the absorption wafer 24 by placing the absorption wafer 24 in a sealed chamber and creating a tornado like vortex of nanoparticles, wherein the nanoparticles are dispersed about and attached to the absorption wafer 24.

The contact layer 25 is a transparent metal oxide or similar material that is applied to the absorption wafer 24 that allows light to pass through to the absorption wafer 24 in addition to serving as a contact. In the preferred embodiment of the present invention, the contact layer 25 is positioned adjacent to the interior volume 5, wherein the subsequent contact 26 is on the exterior of the solar structure 2. However, it is possible for the first photovoltaic cell 22 to be flipped in other embodiments of the present invention, wherein the subsequent contact 26 is positioned adjacent to the interior volume 5 and the contact layer 25 is positioned about the exterior of the solar structure 2.

In other embodiments of the present invention, a contact other than the plurality of nanomaterials may be used as the subsequent contact 26. The subsequent contact 26 is positioned about the absorption wafer 24 opposite the contact layer 25, wherein the absorption wafer 24 is sandwiched in between the contact layer 25 and the subsequent contact 26. In one embodiment, the subsequent contact 26 comprises a plurality of busbars and a plurality of contact wires; the plurality of busbars and the plurality of contact wires being linearly distributed about absorption wafer 24. In another embodiment, the subsequent contact 26 is formed from printed electronics. The contact layer 25 and the subsequent contact 26 provide the means for cycling electrical current through a circuit.

In some embodiments of the present invention, the first photovoltaic cell 22 further comprises a plurality of nanoscale pores 27, as depicted in FIG. 6. The plurality of nanoscale pores 27 traverses into the absorption wafer 24 and act to reduce the reflectivity of the absorption wafer 24. Furthermore, the plurality of nanoscale pores 27 allows for the penetration of photons inside the first photovoltaic cell 22 and promotes the bouncing of photons to generate increased electrical power.

The first photovoltaic cell 22 may also be piranha etched in some embodiments of the present invention. More specifically, the plurality of nanomaterials is piranha etched. A piranha solution, being a mixture of sulfuric acid and hydrogen peroxide, is used to clean organic residues off of the plurality of nanomaterials.

In alternative embodiments of the present invention, each of the plurality of solar cells 21 further comprises a second photovoltaic cell 23, wherein the first photovoltaic cell 22 and the second photovoltaic cell 23 absorb light from different side of the solar structure 2. In reference to FIG. 4, the second photovoltaic cell 23 of each of the plurality of solar cells 21 is positioned adjacent to the interior volume 5, wherein the second photovoltaic cell 23 of each of the plurality of solar cells 21 absorbs light scattered within the interior volume 5 through the concentrated photovoltaic lens 28. The first photovoltaic cell 22 is positioned adjacent to the second photovoltaic cell 23 opposite the interior volume 5 for each of the plurality of solar cells 21, wherein the first photovoltaic cell 22 absorbs light about the exterior of the solar structure 2.

Figure 7:
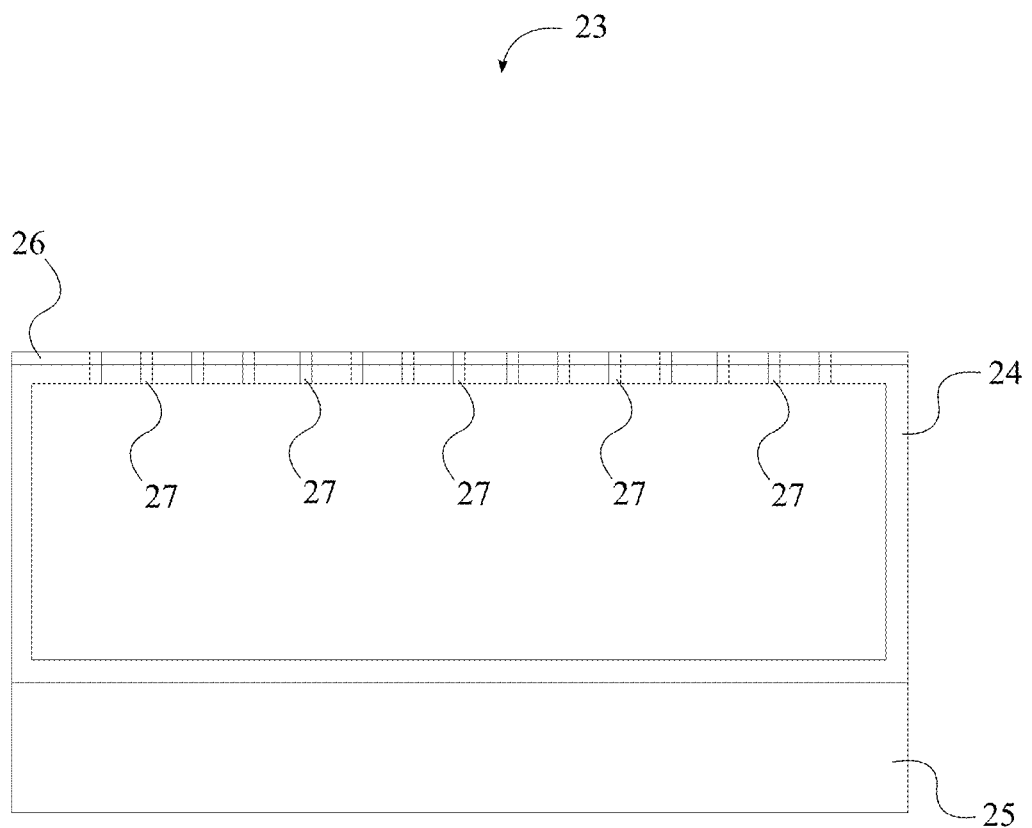
FIG. 7 is a sectional view of the second photovoltaic cell for each of the plurality of solar cells.

In reference to FIG. 7, the second photovoltaic cell 23 comprises an absorption wafer 24, a contact layer 25, and a subsequent contact 26. The absorption wafer 24 of the second photovoltaic cell 23 is a semiconductor that absorbs light energy and provides a p-n junction to generate an electric current. The absorption wafer 24 of the second photovoltaic cell 23 can provide a single-junction or multi junctions depending on the embodiment and desired usage of the present invention. In the preferred embodiment of the present invention, the absorption wafer 24 of the second photovoltaic cell 23 is a crystalline silicone that provides a single-junction, however, in other embodiments of the present invention, the absorption wafer 24 of the second photovoltaic cell 23 may also be a thin film technology, multiple thin film technologies forming a multi-junction, or other photovoltaic material.

In further reference to FIG. 7, the subsequent contact 26 of the second photovoltaic cell 23 is positioned on the absorption wafer 24 of the second photovoltaic cell 23 opposite the contact layer 25 of the second photovoltaic cell 23, wherein the subsequent contact 26 of the second photovoltaic cell 23 completes a circuit with the contact layer 25 of the second photovoltaic cell 23. In the preferred embodiment of the present invention, the subsequent contact 26 of the second photovoltaic cell 23 is a plurality of nanomaterials that includes copper nanowire, liquid metallic carbon nanotubes, and other nanoparticles. The plurality of nanomaterials of the second photovoltaic cell 23 acts to further increase the absorption of light and thus increase the overall efficiency of each of the plurality of solar cells 21. In the preferred embodiment of the present invention, the plurality of nanomaterials of the second photovoltaic cell 23 is applied to the absorption wafer 24 of the second photovoltaic cell 23 by placing the absorption wafer 24 of the second photovoltaic cell 23 in a sealed chamber and creating a tornado like vortex of nanoparticles, wherein the nanoparticles are dispersed about and attached to the absorption wafer 24.

The contact layer 25 of the second photovoltaic cell 23 is an opaque or transparent metal oxide, or similar material, that is applied to the absorption wafer 24 of the second photovoltaic cell 23 and serves as a contact. Similarly, the contact layer 25 of the first photovoltaic cell 22 may also be opaque. The contact layer 25 of the second photovoltaic cell 23 is positioned adjacent to the contact layer of the first photovoltaic cell 22. In this way the subsequent contact 26 of the first photovoltaic cell 22 is on the exterior of the solar structure 2, while the subsequent contact 26 of the second photovoltaic cell 23 is on the interior of the solar structure 2, adjacent to the interior volume 5.

In other embodiments of the present invention, a contact other than the plurality of nanomaterials may be used as the subsequent contact 26 of the second photovoltaic cell 23. The subsequent contact 26 of the second photovoltaic cell 23 is positioned about the absorption wafer 24 of the second photovoltaic cell 23 opposite the contact layer 25 of the second photovoltaic cell 23, wherein the absorption wafer 24 of the second photovoltaic cell 23 is sandwiched in between the contact layer 25 of the second photovoltaic cell 23 and the subsequent contact 26 of the second photovoltaic cell 23. In one embodiment, the subsequent contact 26 of the second photovoltaic cell 23 comprises a plurality of busbars and a plurality of contact wires; the plurality of busbars of the second photovoltaic cell 23 and the plurality of contact wires of the second photovoltaic cell 23 being linearly distributed about absorption wafer 24 of the second photovoltaic cell 23. In another embodiment, the contact layer 25 of the second photovoltaic cell 23 and the subsequent contact 26 of the second photovoltaic cell 23 provide the means for cycling electrical current through a circuit.

In some embodiments of the present invention, the second photovoltaic cell 23 further comprises a plurality of nanoscale pores 27, as depicted in FIG. 7. The plurality of nanoscale pores 27 of the second photovoltaic cell 23 traverses into the absorption wafer 24 of the second photovoltaic cell 23 and act to reduce the reflectivity of the absorption wafer 24 of the second photovoltaic cell 23. Furthermore, the plurality of nanoscale pores 27 of the second photovoltaic cell 23 allows for the penetration of photons inside the second photovoltaic cell 23 and promotes the bouncing of photons to generate increased electrical power.

The second photovoltaic cell 23 may also be piranha etched in some embodiments of the present invention. More specifically, the plurality of nanomaterials of the second photovoltaic cell 23 is piranha etched. A piranha solution, being a mixture of sulfuric acid and hydrogen peroxide, is used to clean organic residues off of the plurality of nanomaterials of the second photovoltaic cell 23.

Figure 1:
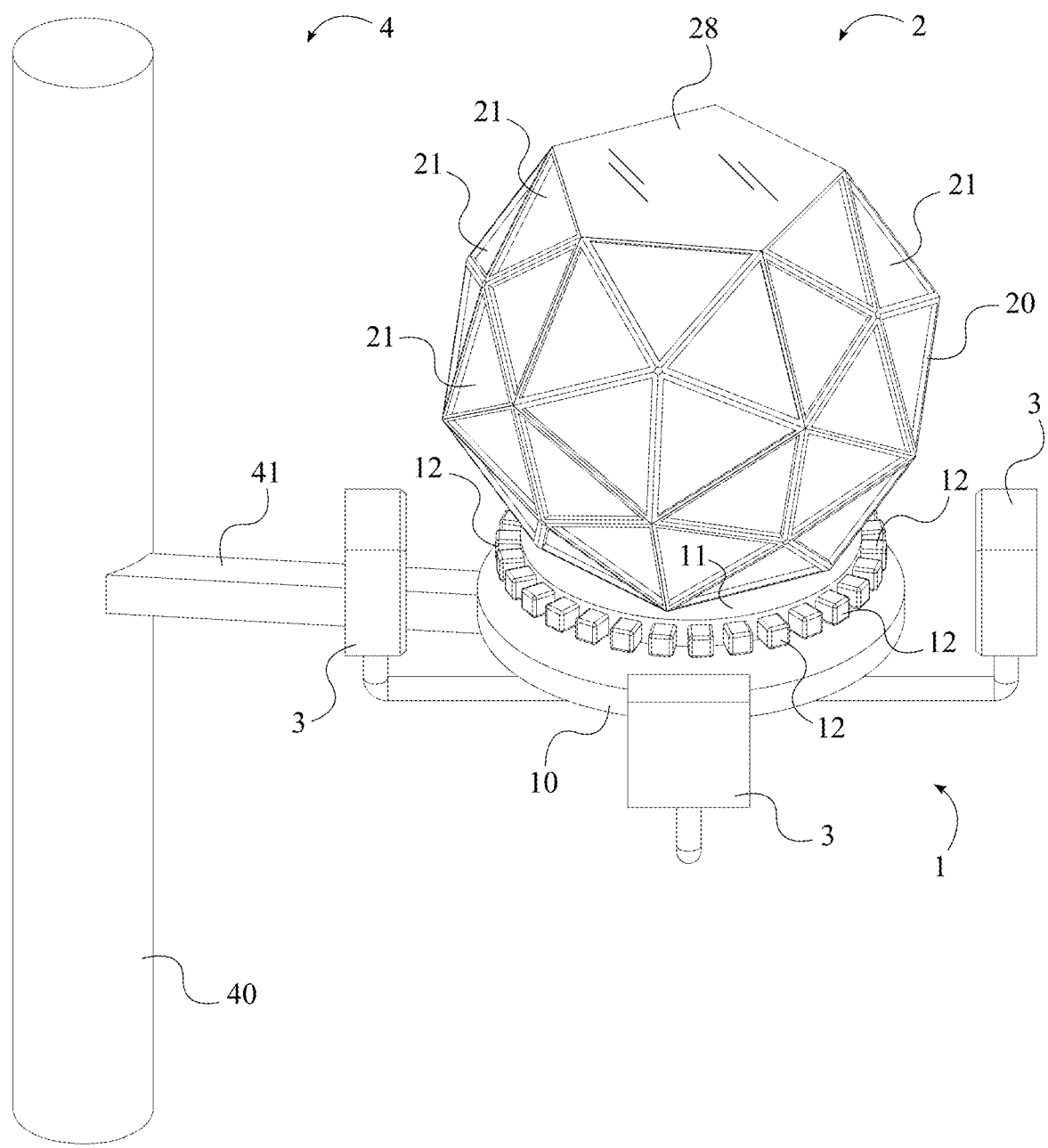
FIG. 1 is a perspective view of the present invention, showing the base panel unit, the solar structure, the module support structure, and the plurality of acoustic levitation modules.
Figure 2:
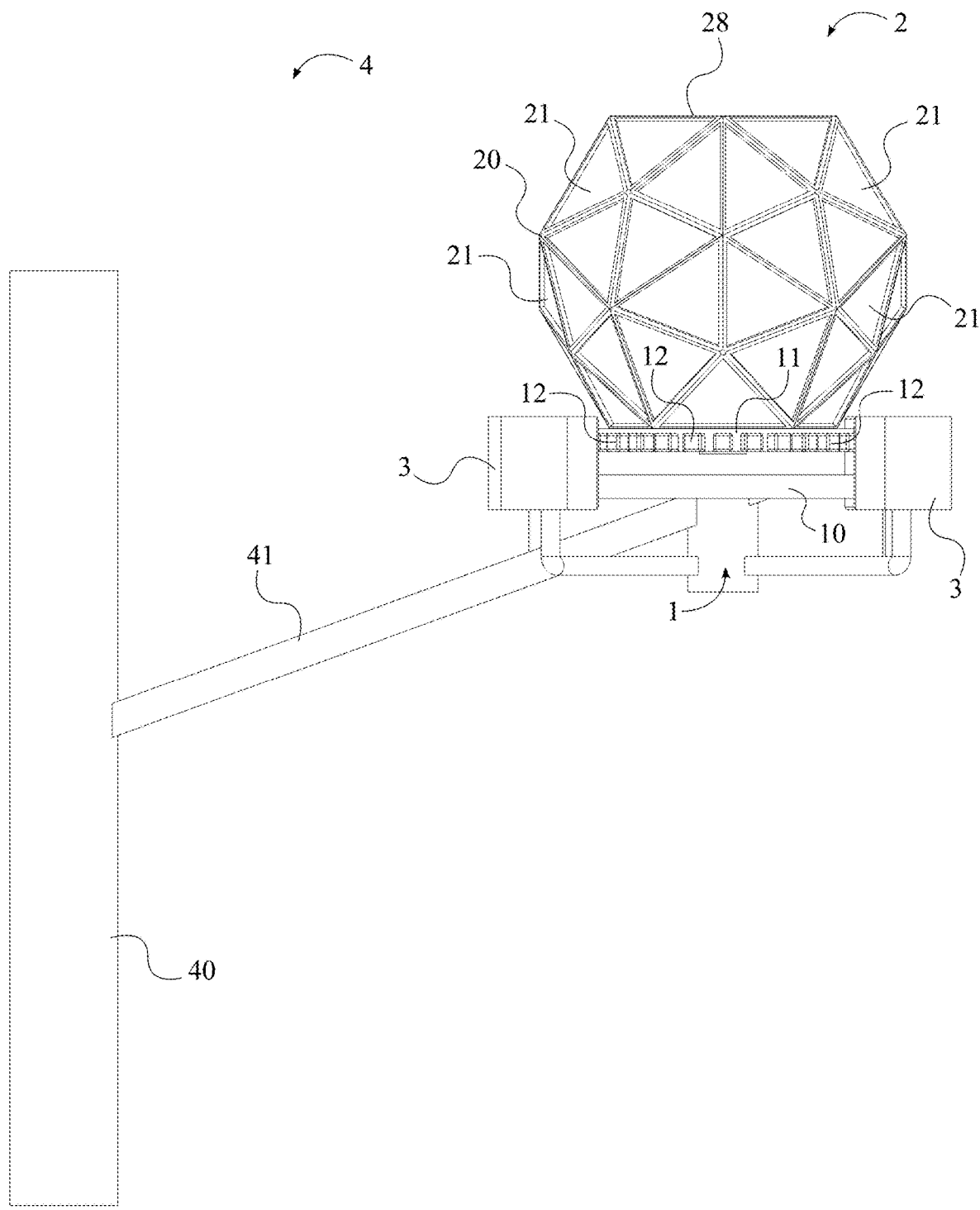
FIG. 2 is a front elevational view of the present invention, wherein the rotational base is magnetically levitated above the magnetic base.
Figure 8:
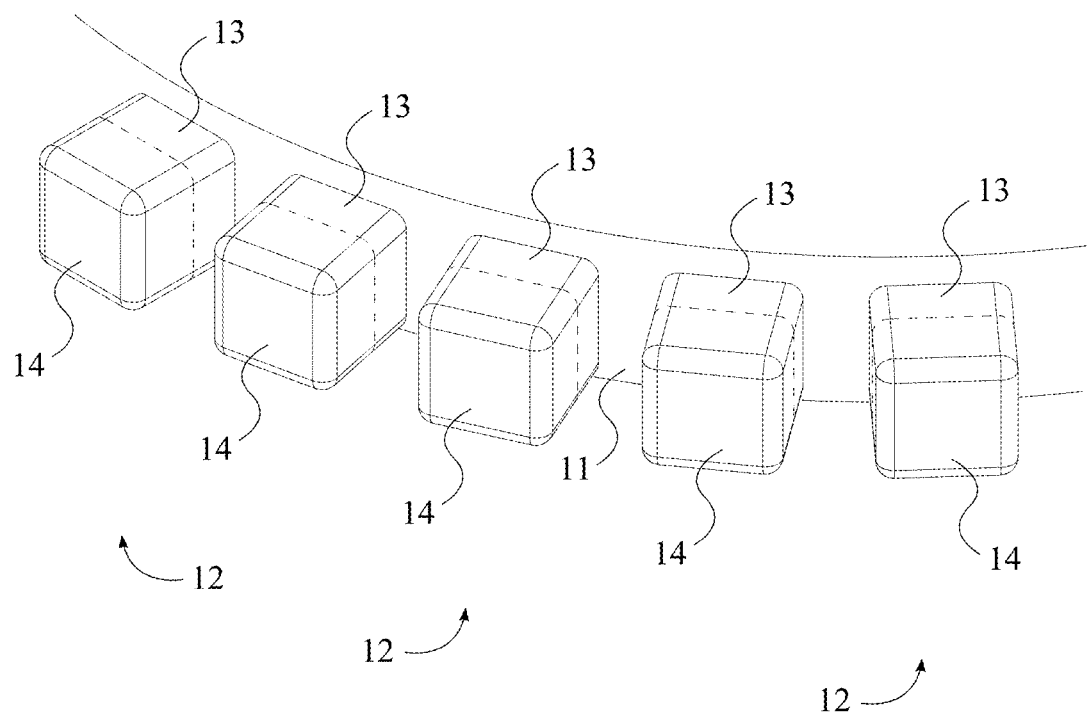
FIG. 8 is a section view of the rotational base and the plurality of magnets, depicting the first pole and the second pole of each of the plurality of magnets.

In reference to FIG. 1-2, the base panel unit 1 comprises a magnetic base 10, a rotational base 11, and a plurality of magnets 12. The solar structure 2 is adjacently connected to the rotational base 11, while each of the plurality of magnets 12 is adjacently connected to the rotational base 11. The plurality of magnets 12 is perimetrically positioned about the rotational base 11, wherein the plurality of magnets 12 is evenly dispersed around the rotational base 11. Furthermore, each of the plurality of magnets 12 comprises a first pole 13 and a second pole 14; the first pole 13 being a North pole and the second pole 14 being a South pole, or vice versa. The first pole 13 is positioned in between the rotational base 11 and the second pole 14, as depicted in FIG. 8. The first pole 13 has a magnetic field directed out, towards the rotational base 11, while the second pole 14 has a magnetic field directed out, away from the magnetic base 10. The identical orientation of each of the plurality of magnets 12 causes the magnetic field of the first pole 13 and the second pole 14 of adjacent magnets to repel each other, thus forming a magnetic vortex.

Figure 11:
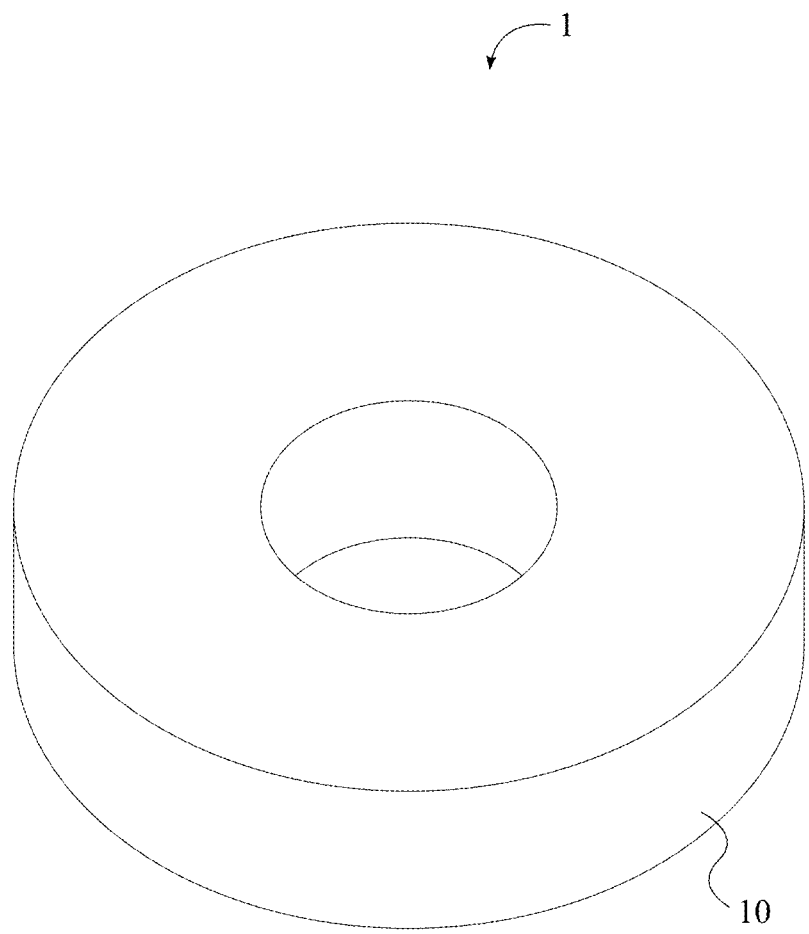
FIG. 11 is a perspective view of the magnetic base of the base panel unit, wherein the magnetic base has a center hole for creating a magnetic vortex.

In reference to FIG. 2, the rotational base 11 is positioned in between the magnetic base 10 and the solar structure 2, wherein the rotational base 11 is suspended above and/or around the magnetic base 10. The magnetic base 10 provides a magnetic force to levitate the rotational base 11 at a fixed distance from the magnetic base 10. The orientation of the plurality of magnets 12 about the rotational base 11 induces the magnetic vortex that, in turn with the magnetic force of the magnetic base 10, causes the rotational base 11, and subsequently the solar structure 2, to spin around a vertical axis. Furthermore, the magnetic base 10 has a center hole, as shown in FIG. 11, to facilitate the magnetic vortex. The spin of the rotational base 11 and the solar structure 2 acts to cool the solar structure 2 and thus increase the efficiency of the present invention.

Figure 5:
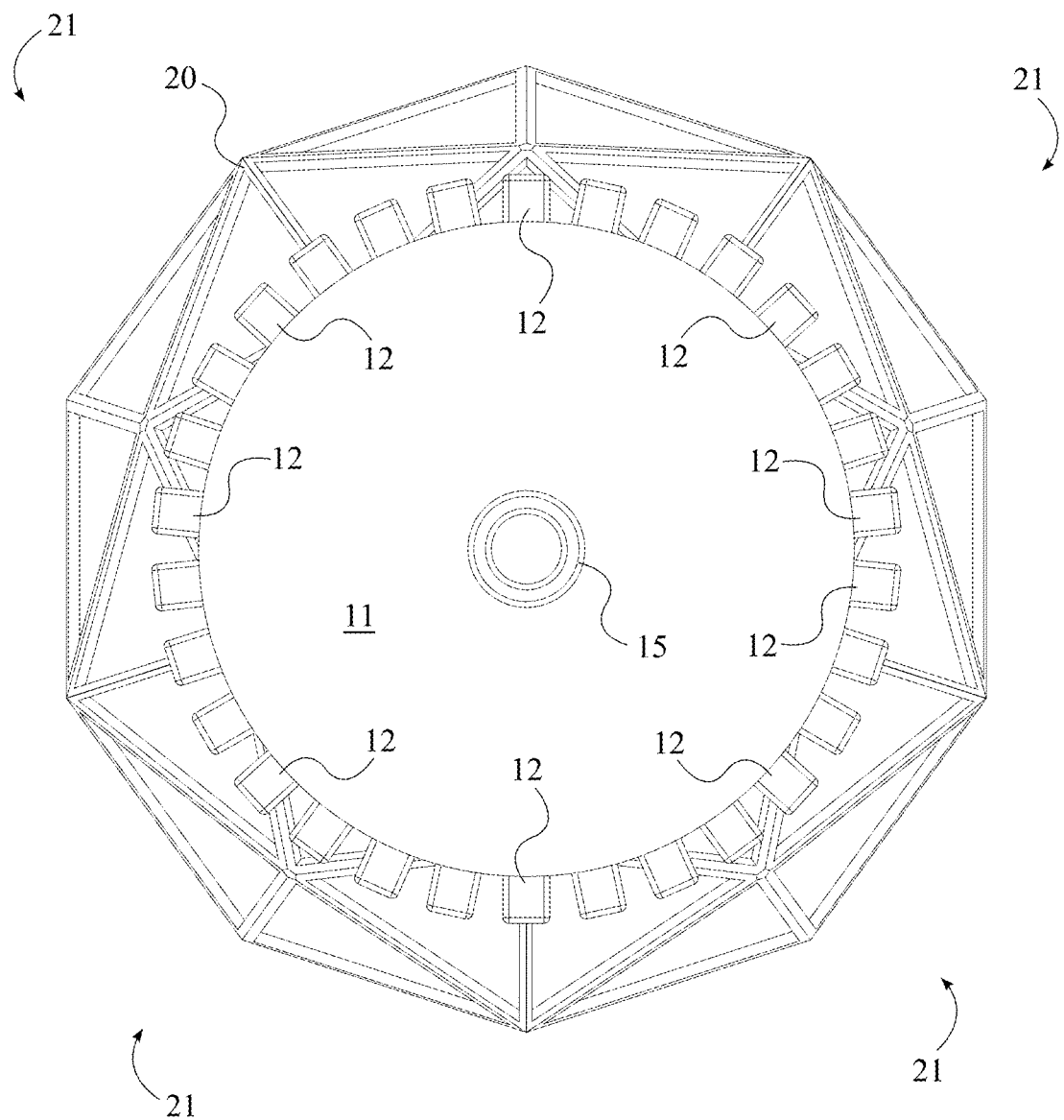
FIG. 5 is a bottom plan view of the rotational base and the solar structure.

In reference to FIG. 5, the base panel unit 1 further comprises a ball bearing 15 that is positioned through the rotational base 11, wherein the ball bearing 15 is concentrically positioned with the rotational base 11. The ball bearing 15 provides a means for an opening through which electrical wires can be positioned such that the electrical wires do not become twisted as the rotational base 11 and the solar structure 2 spin about the magnetic base 10. The electrical wires are used to connect each of the plurality of solar cells 21 to batteries, power lines, inverters, etc.

Figure 12:
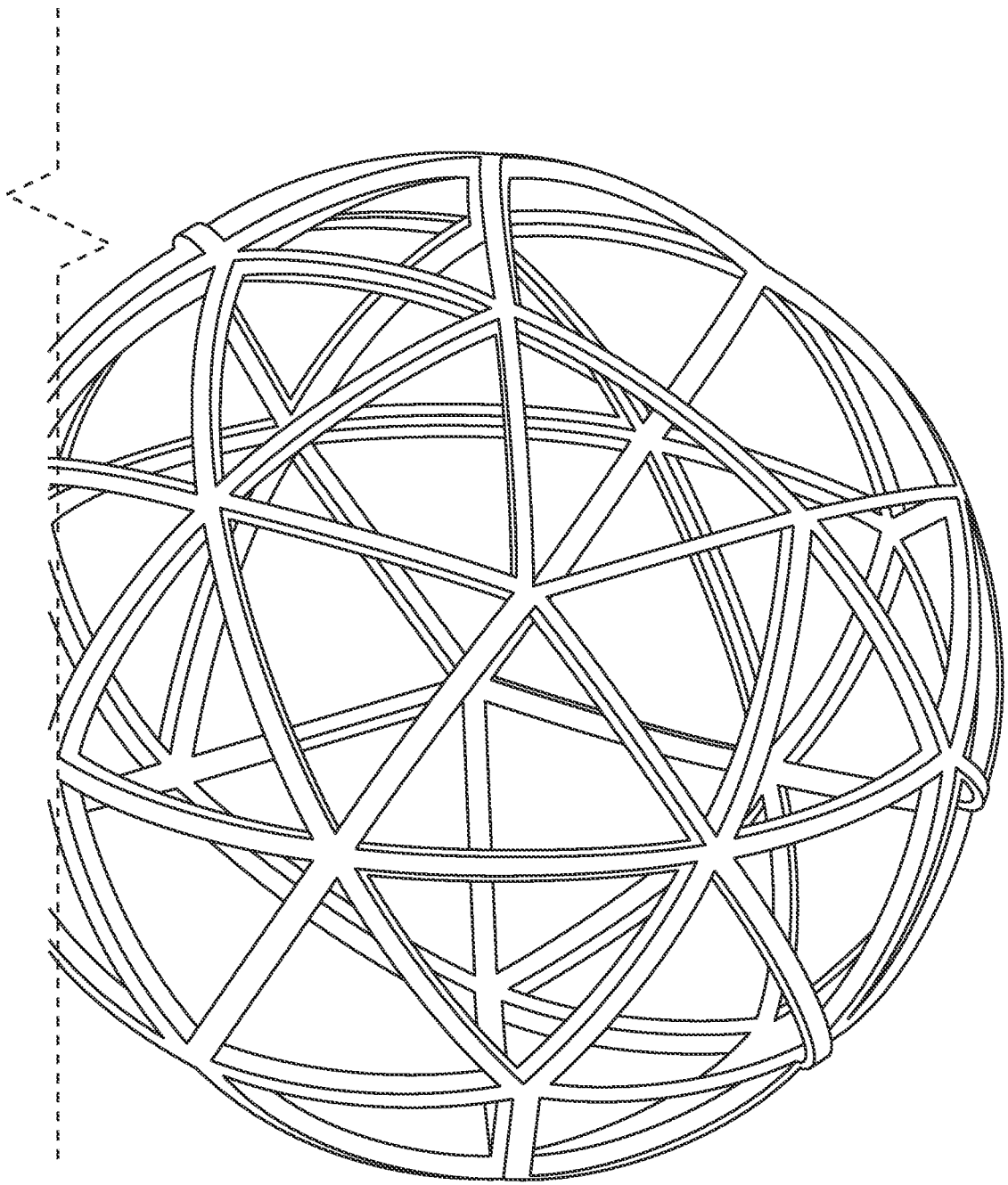
FIG. 12 is a perspective view of the solar frame, wherein the solar frame 5 is spherical to reduce drag as the solar structure rotates.
Figure 13:
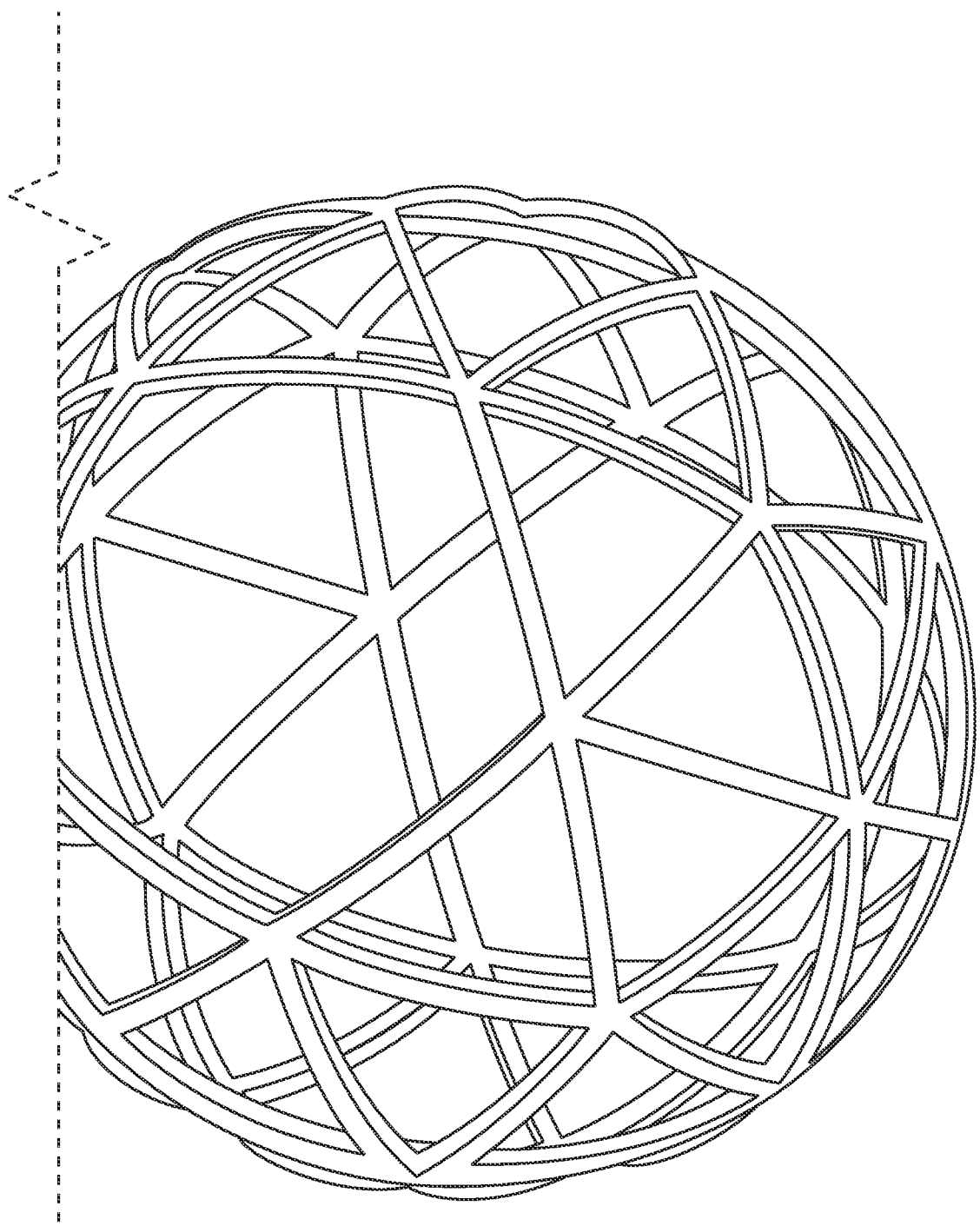
FIG. 13 is another perspective view of the solar frame having the spherical shape.
Figure 14:
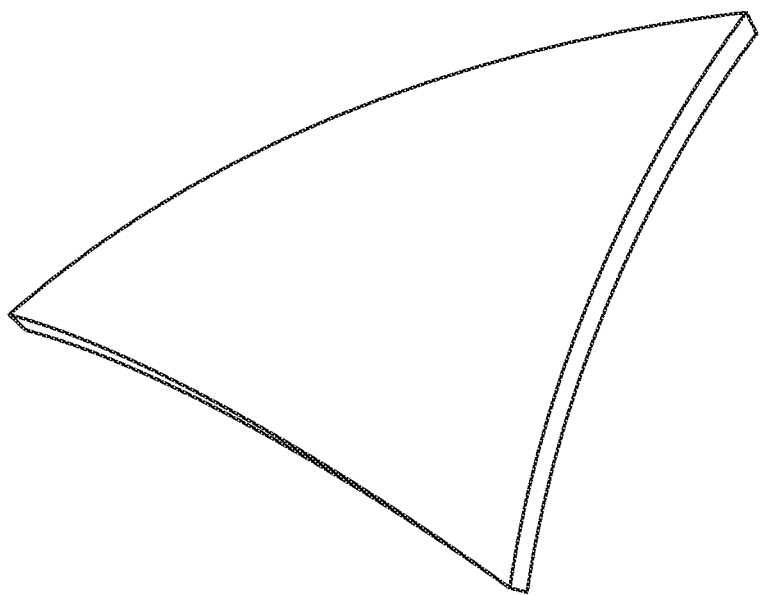
FIG. 14 is a perspective view of on the plurality of solar cells being curved to fit the spherical shape of the solar frame.
Figure 15:
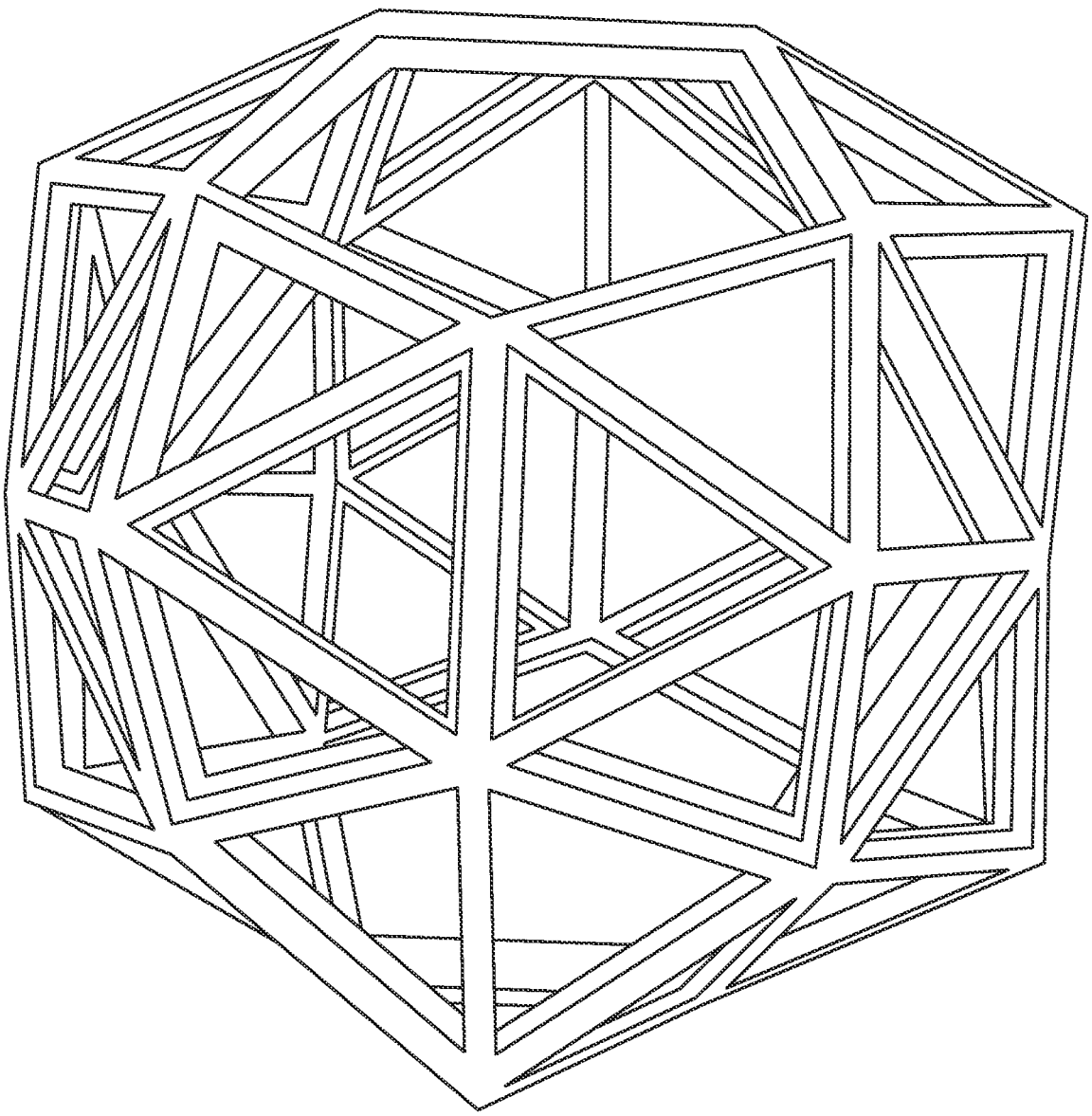
FIG. 15 is a perspective view of on the plurality of solar cells of a polyhedron arrangement.

In reference to FIG. 12-14, in the preferred embodiment of the present invention the solar structure 2 is spherical in shape, thus the solar frame 20 is designed to have no angles. Additionally, each of the plurality of solar cells 21 is curved in order to match the contour of the solar frame 20. The spherical design of the solar structure 2 is ideal as it reduces the drag of the solar structure 2, as the solar structure 2 rotates.

Figure 9:
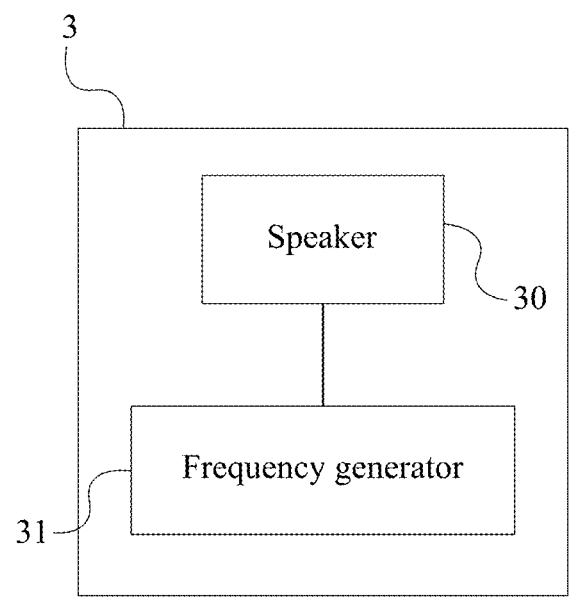
FIG. 9 is a diagram depicting the electrical connection between the speaker and the frequency generator of each of the plurality of acoustic levitation modules.

In reference to FIG. 1, the plurality of acoustic levitation modules 3 is perimetrically positioned around the base panel unit 1, wherein the plurality of acoustic levitation modules 3 is used to stabilize the rotational base 11 as the rotational base 11 levitates and spins above the magnetic base 10. Each of the plurality of acoustic levitation modules 3 comprises a speaker 30 and a frequency generator 31, wherein the frequency generator 31 is electrically connected to the speaker 30, as depicted in FIG. 9. The speaker 30 of each of the plurality of acoustic levitation modules 3 is oriented towards the base panel unit 1, wherein the speaker 30 produces and directs sounds waves towards the base panel unit 1 at a frequency determined by the frequency generator 31. The plurality of acoustic levitation modules 3 uses acoustic radiation pressure to controllably move the rotational base 11 and the solar structure 2 as the rotational base 11 and the solar structure 2 hover about the magnetic base 10.

In reference to FIG. 1-2, the module support structure 4 provides a mount to which the base panel unit 1 is adjacently connected, wherein the module support structure 4 raises the base panel unit 1, and in turn the solar structure 2, wherein the solar structure 2 can be optimally positioned as to receive maximum light exposure. The module support structure 4 comprises a main support 40 and a branch 41, wherein the branch 41 is terminally connected to the main support 40. The base panel unit 1 is adjacently connected to the branch 41 opposite the main support 40; more specifically, the magnetic base 10 is adjacently connected to the module support structure 4.

The module support structure 4 also allows multiple three-dimensional photovoltaic modules to be supported in one location. A plurality of subsequent branches can also be terminally connected to the main support 40, wherein each of the plurality of subsequent branches supports a subsequent base panel unit 1 and a subsequent solar structure 2. The plurality of subsequent branches can each be of different lengths and are staggered in order to optimally positioned each of the three-dimensional photovoltaic modules, such that each of the three-dimensional photovoltaic modules receives maximum light exposure. This is turn increases the efficiency of using multiple three-dimensional photovoltaic modules at one time.

Figure 10:
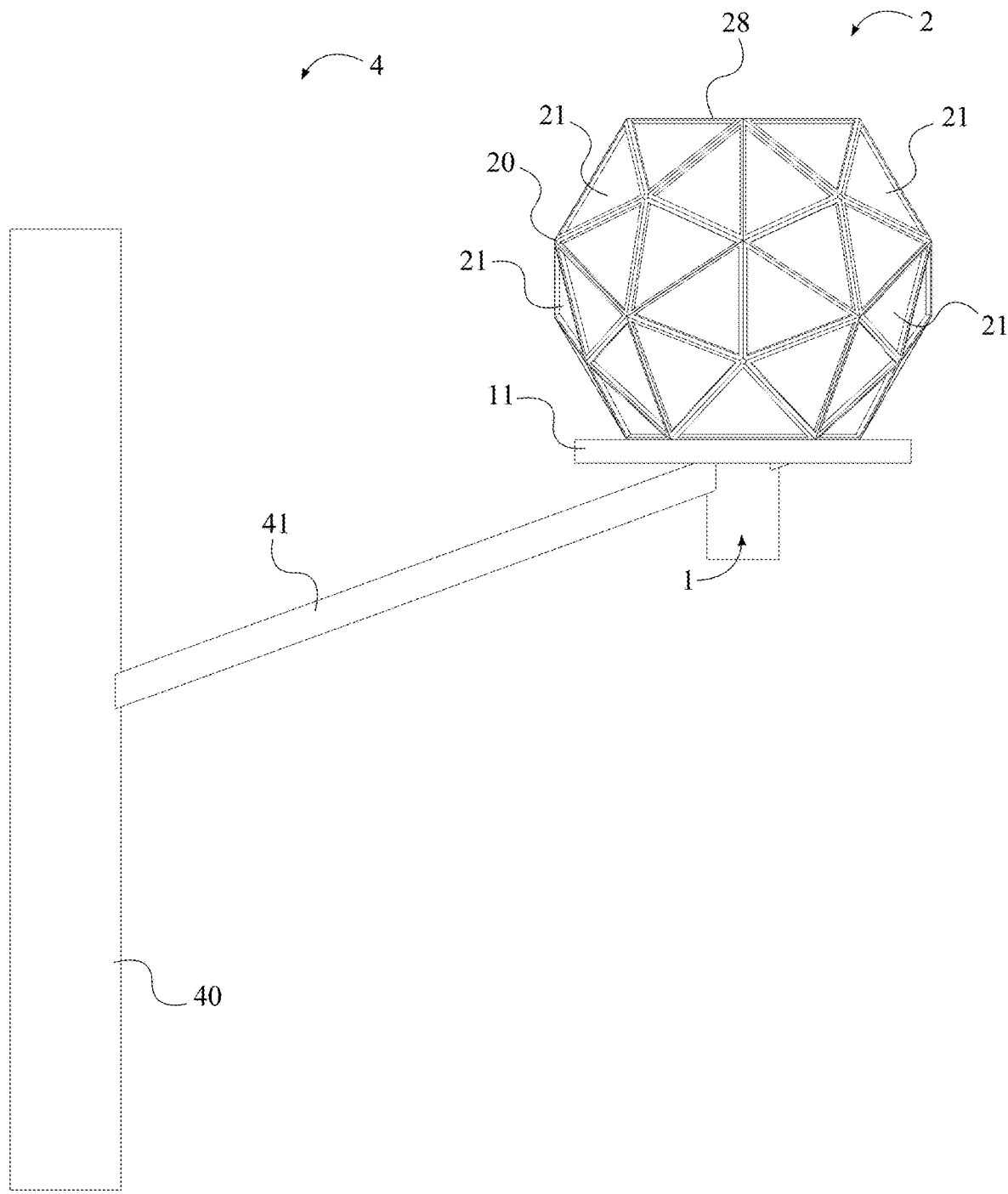
FIG. 10 is a perspective view of the present invention, wherein the rotational base is directly connected to the module support structure.

In reference to FIG. 10, in other embodiments of the present invention, the magnetic base 10 may be excluded, wherein the rotational base 11 is rotatably connected to the module support structure 4. A rotational base 11 is terminally connected to the drive shaft of a motor, wherein the motor is used to drive rotation of the rotational base 11 and the solar structure 2. The motor can be powered directly from the solar structure 2, or the secondary power source can be used to power the motor.

The present invention is directed to 3D printing of a solar frame to create a 3D solar system. The present invention includes 3D printing and additive manufacturing techniques to create a system for absorption of solar energy.

Various 3D and additive manufacturing techniques such as SLS can be used to create the structure of the solar frame. Other technologies such as volumetric printing may also be used to create the solar frame.

In certain embodiments of the invention, a 3D printer is used to 3D print these plastic 3D Structures to make a flat 3D version that is compatible with the current flat panel solar panel production lines.

The present invention involves a 3D printer that makes these plastic 3D structures. The plastic 3D structures are assembled into a solar panel. Double sided solar cells (Triangles) can be placed in design. Or Solar triangles can be placed on the top and bottom of design facing back-to-back from each other giving the design double the amount of light absorption compared to conventional flat solar panels.

In certain embodiments, the invention has textured lattices in its plastic 3D printed structure giving the invention the ability to absorb sunlight from the top and bottom of design. In certain embodiments, there is a diamond studded reflection plate/mirror or other reflection alternatives that reflects light upward so the solar cells underneath absorb sunlight at the same time as the top of the model.

Figure 16:
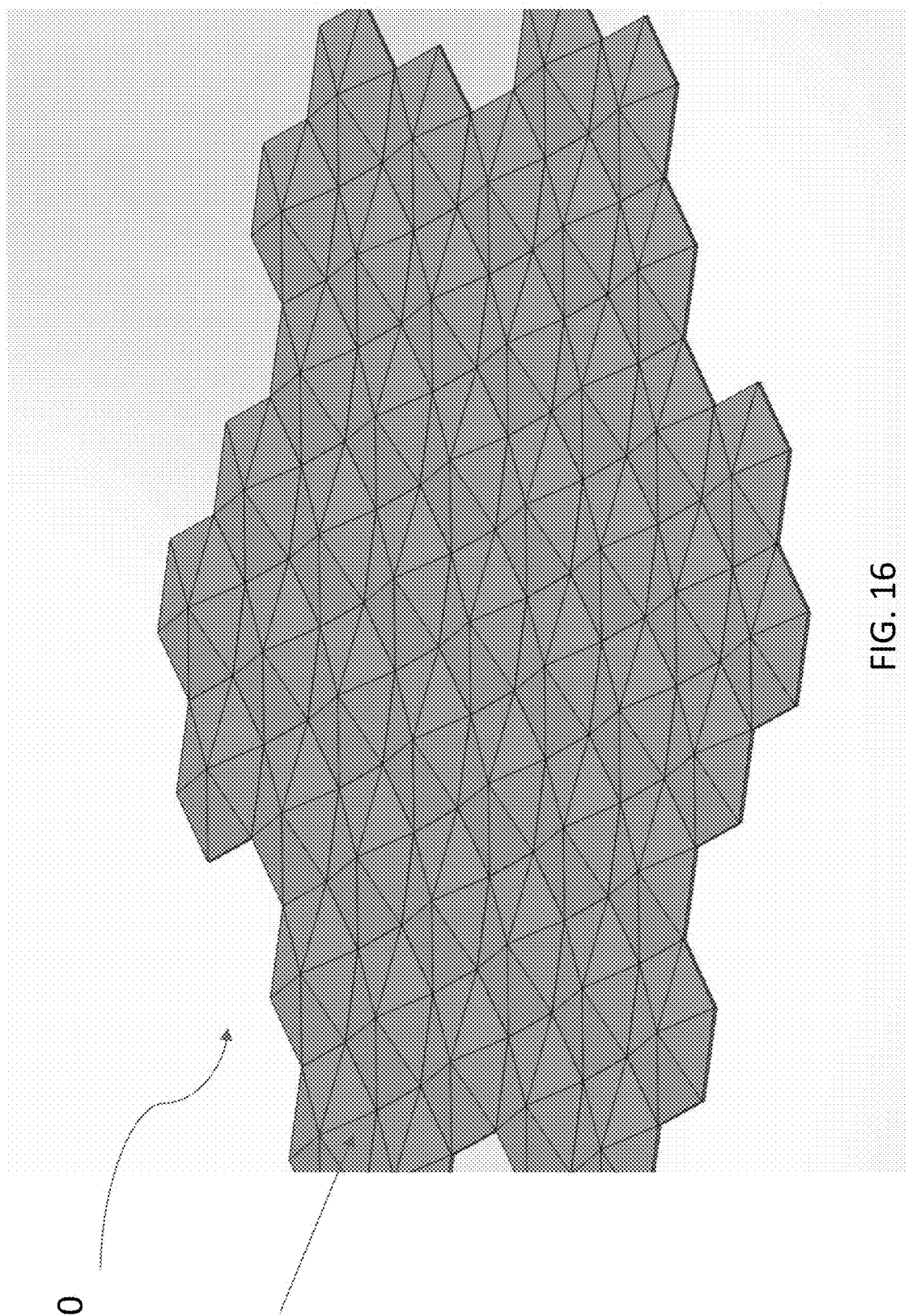
FIG. 16 is a schematic view of an embodiment of the invention directed to a 3D printed three-dimensional solar photovoltaic system having a plurality of solar cells on a frame.

FIG. 16 shows another embodiment of the invention. In FIG. 16, the three-dimensional solar photovoltaic system 1000 is shown. In certain embodiments, the solar photovoltaic system including the solar frame is printed via a 3D printer. A 3D printer is necessary to intricately print the uneven surfaces of the solar frame.

Figure 20:
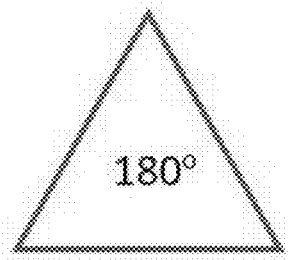
FIG. 20 is a view of certain contemplated polygons of the shapes of the plurality of solar cells.
Figure 20:
Figure 20:
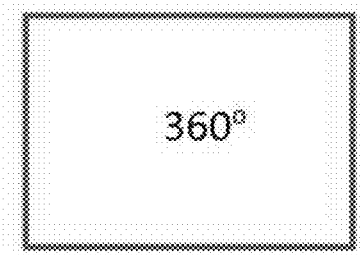
Figure 20:
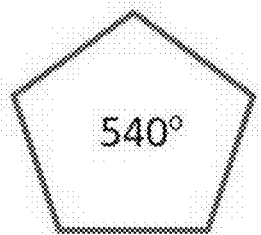
Figure 20:
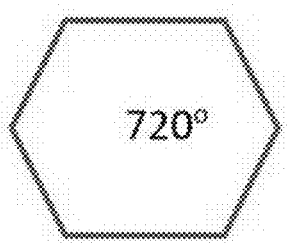
Figure 20:
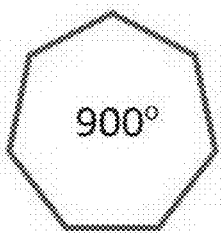
Figure 20:
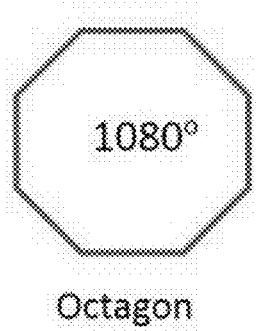
Figure 20:
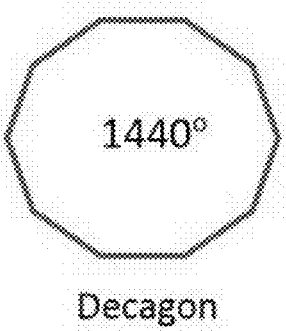

In FIG. 16, triangular solar cells 1030 are shown integrated within the solar frame 1010. The solar cells may have other configurations such as a polygon, square, rectangle, pentagon, hexagon, heptagon, octagon and decagon and other configurations for solar cell designs. These configurations are shown in FIG. 20.

Figure 17:
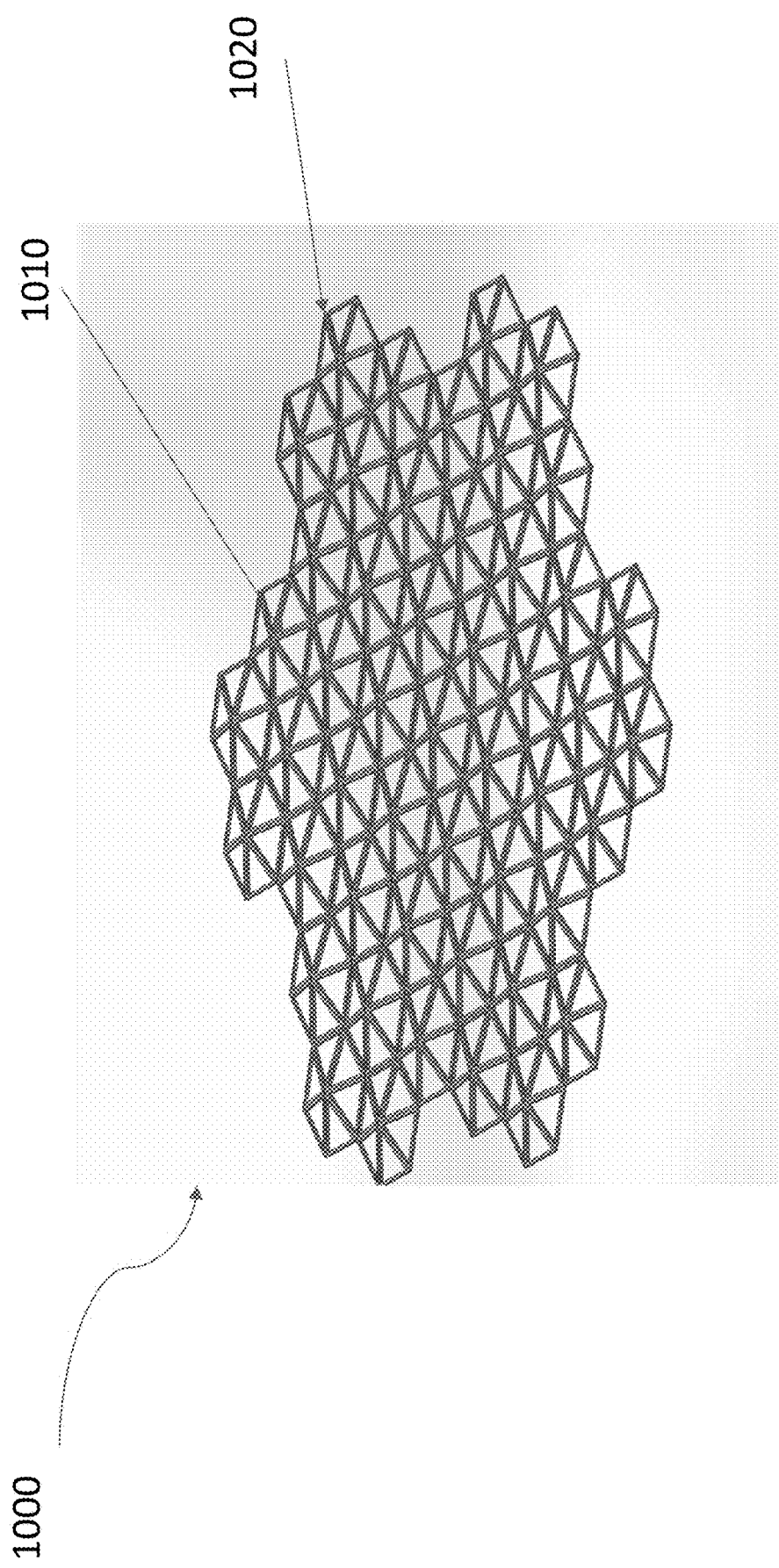
FIG. 17 is a schematic view of an embodiment of the invention of FIG. 16 without the plurality of solar cells and just showing the frame.

In FIG. 17, solar frame 1010 is provided having windows 1020. The solar frame 1010 is shown having an uneven surface such that the orientation of solar cells placed within the frame can be irregular or can have an organized disorganization such that the cells are directed towards the at different angles. Having the solar cells be oriented at different angles to the sun allows for maximum absorption of sunlight.

Figure 18:
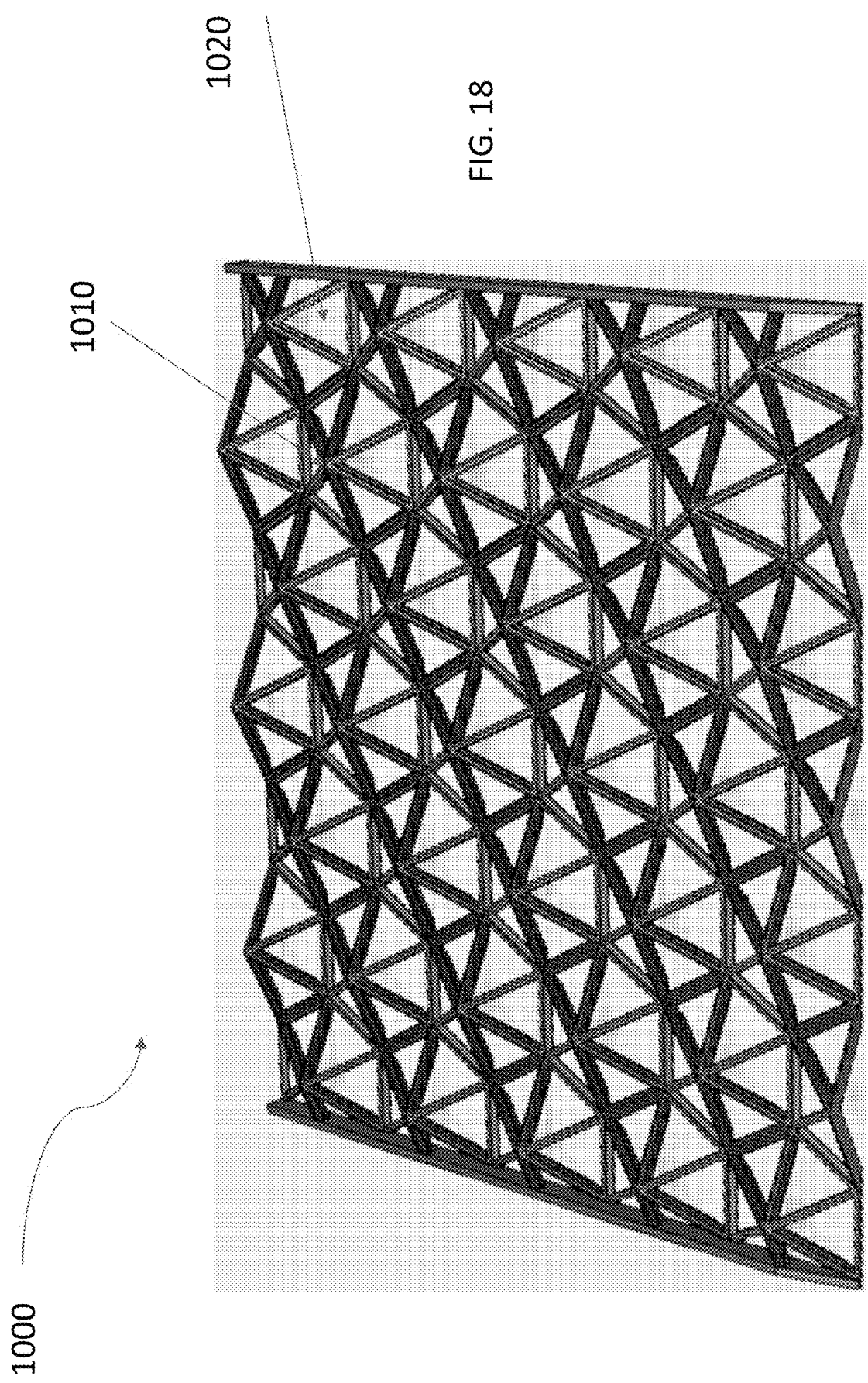
FIG. 18 is a perspective view of an embodiment of the invention of FIG. 16 without the plurality of solar cells and just showing the frame.

In FIG. 18, solar frame 1010 is shown having an organized structure of uneven surfaces such that the solar frame is able to position solar cells in windows 1020 in various angles with respect to the sun.

Figure 19:
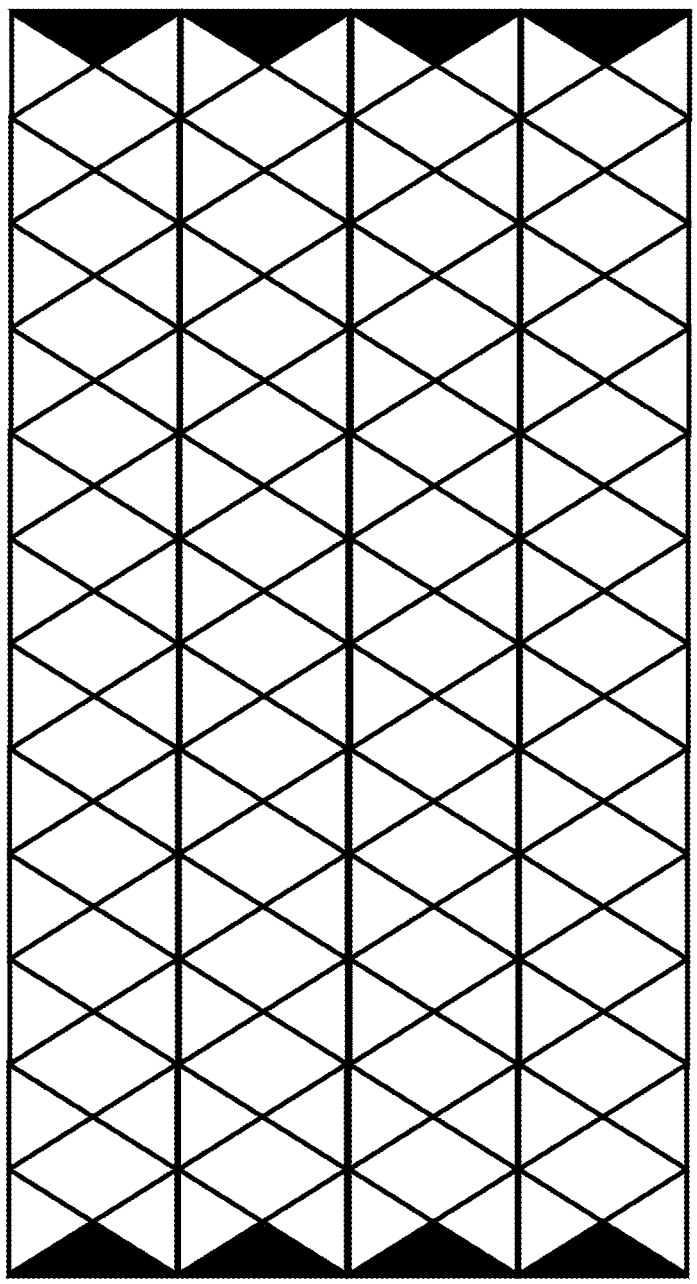
FIG. 19 is a 2-dimensional view flattened of the structure of FIG. 18 showing how the plurality of solar cells are triangles forming pentagonal structures.

FIG. 19 shows a 2-Dimensional view flattened of the structure of FIG. 18 showing how the plurality of solar cells are triangles forming pentagonal structures. In certain embodiments, the pentagonal structures can be replaced by other group structures of triangular shaped solar cells such hexagon, heptagon, octagon and decagon groupings.

Figure 21:
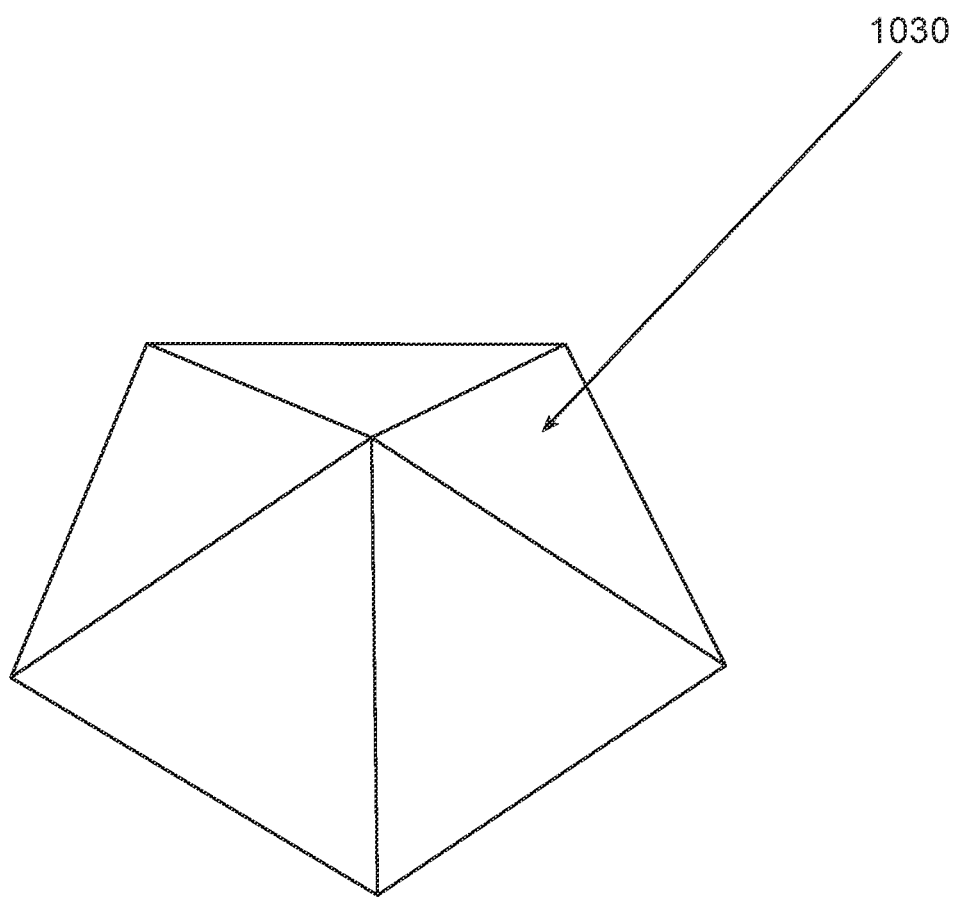
FIG. 21 is view of a pentagonal structure of a group of triangular solar cells.

FIG. 21 is view of a pentagonal structure 1030 of a group of triangular solar cells. The polygon structure shown is a 3D structure that is raised and that has an uppermost center point. The polygon structure is configured to hold the five triangular solar cells and provides an economical arrangement to absorb solar energy.

Figure 22:
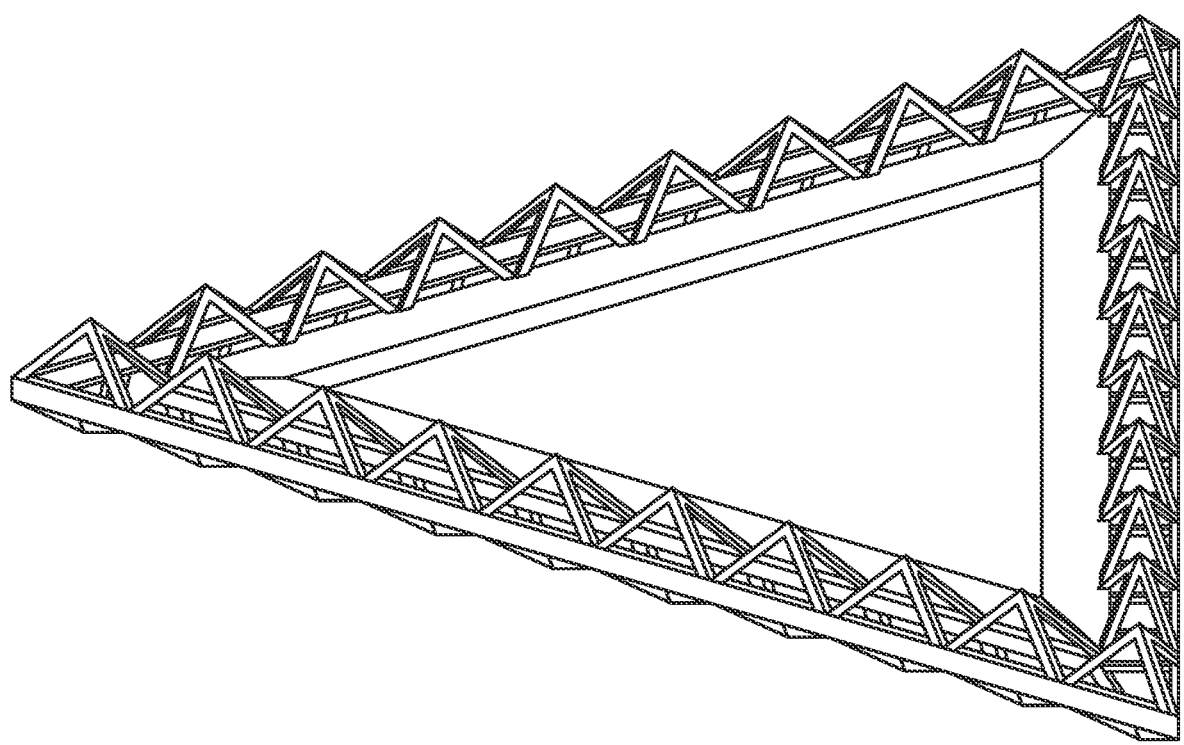
FIG. 22 is a portion of the solar frame for triangular solar cells. The solar frame has pin holes that allow for light to pass through the frame.

FIG. 22 is a portion of the solar frame for triangular solar cells. The solar frame has pin holes that allow for light to pass through the frame. When the solar cells are positioned within the solar frame, the pin holes in the solar frame allow for light to pass through the solar frame. The pin holes allow for maximum light absorption in the system.

In certain embodiments, the solar frame is transparent, and in other embodiments, the pinholes are sufficient to allow for light to pass through the solar frame.

In certain embodiments, the system includes pin like holes in the 3D printed plastic frame.

Figure 23:
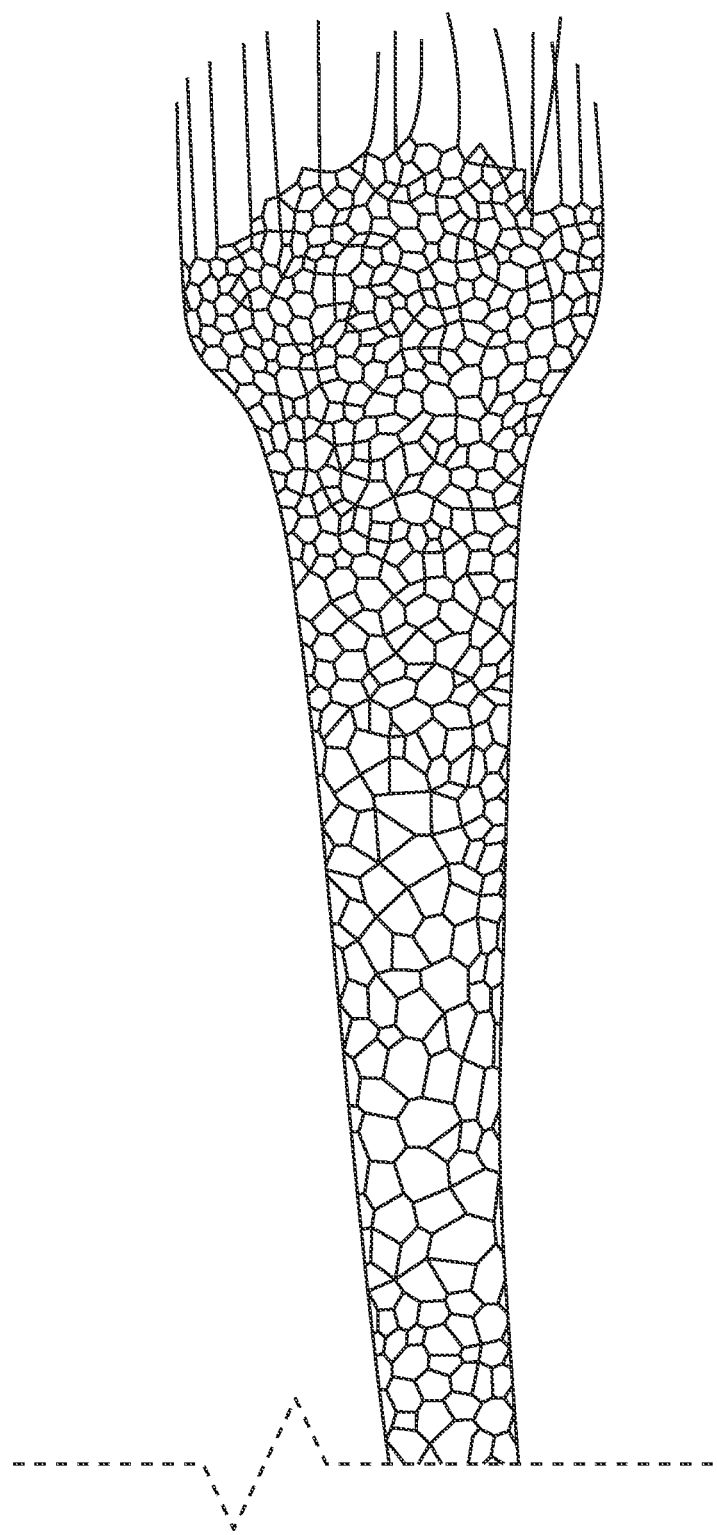
FIG. 23 is a lattice or mesh structure whereby the solar frame is irregular and is able to hold solar cells of various configurations and shapes.

FIG. 23 is a lattice or mesh structure whereby the solar frame is irregular and is able to hold solar cells of various configurations and shapes. In certain embodiments, the 3D solar frame is configured to hold solar cells of various shapes and sizes. The mesh structure of the solar frame is flexible and able to deform to the shape of the various solar cells. The lattices shown in FIG. 23 are an example of lattices that could be used in the Plastic 3D Printed Solar Frame.

Figure 24:
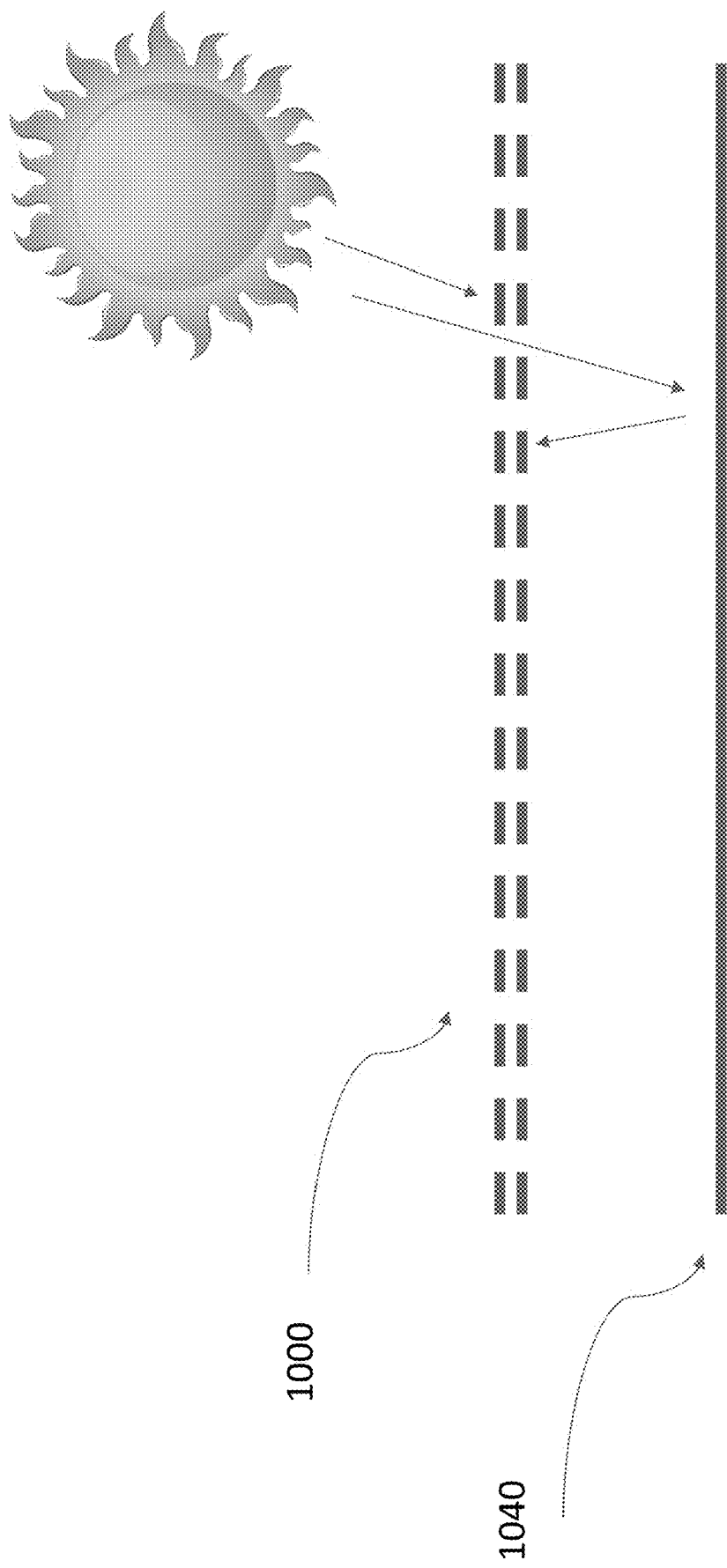
FIG. 24 is a representation of the solar frame and reflective element such that sunlight is able to be absorbed at the top of the system and reflected sunlight is able to be absorbed by the underneath portion of the system.

FIG. 24 is a representation of the solar frame and reflective element such that sunlight is able to be absorbed at the top of the system and reflected sunlight is able to be absorbed by the underneath portion of the system.

In FIG. 24, the sun is shown having its rays and solar energy transmitted. Some of the solar rays are able to pass through the solar system 1000, specifically the solar frame 1010. These rays are then shown hitting reflective surface or reflection plate 1040 and then reflected back to the underneath portion of the system 1000.

In certain embodiments, the plurality of solar cells are double sided solar cells, such that the solar cells can absorb both the direct sunlight and the reflected sunlight from the reflective element, which is a mirror, plate or diamond-studded plate.

In other embodiments, the plurality of solar cells are one-sided solar cells, such that the such that the absorption surface of the top solar cells on the top of the system faces towards the sun, while the absorption surface of the bottom solar cells faces towards the reflective element. In this manner, the system is able to capture both the direct sunlight and the reflected sunlight from the reflective element, thus providing more efficient absorption of energy within the same surface area of a solar system configuration.

Although the invention has been explained in relation to its preferred embodiment, it is to be understood that many other possible modifications and variations can be made without departing from the spirit and scope of the invention as hereinafter claimed.

The invention claimed is:

1. A three-dimensional solar photovoltaic system comprising:
   a solar structure comprising:
   a 3D polygon solar frame, wherein the 3D polygon solar frame is substantially planar along a longitudinal axis, the 3D solar frame having a top surface and a bottom surface, and
   a plurality of solar cells positioned within the 3D polygon solar frame, the plurality of solar cells arranged within the solar frame in one or more clusters, wherein at least one of the one or more clusters has solar cells that point upwards from the top surface of the 3D polygon solar frame and at least one of the one clusters has solar cells that point downwards from the bottom surface of the 3D polygon solar frame;
   a reflective surface positioned underneath the solar frame, the reflective surface configured to reflect sunlight,
   wherein the plurality of solar cells are oriented at various angles with respect to said reflective surface,
   wherein each of the plurality of solar cells are perimetrically connected to the solar frame, and
   wherein said plurality of solar cells are configured to receive sunlight.

2. The system of claim 1, wherein the solar frame is manufactured via a 3D printer.

3. The system of claim 1, wherein said plurality of solar cells are configured to receive sunlight from the top and bottom of the photovoltaic system.

4. The system of claim 1, wherein the solar frame is transparent.

5. The system of claim 1, wherein the plurality of solar cells are two-sided such that the plurality of solar cells are configured to receive sunlight both directly from the sun and from said reflective surface.

6. The system of claim 1, wherein the plurality of solar cells are faced back-to-back can be absorbed from the top and bottom of design.

7. The system of claim 1, wherein sunlight is configured to pass through the solar frame.

8. The system of claim 1, wherein the reflective surface is selected from a group consisting of a mirror, glass beads, reflective paint, ceramic beads, microcrystalline ceramic beads, and diamond-studded plate, and combinations thereof.

9. The system of claim 1, wherein each of the plurality of solar cells comprises a first photovoltaic cell.

10. The system of claim 9, wherein the first photovoltaic cell comprises a plurality of nanoscale pores and an absorption wafer; and the plurality of nanoscale pores traversing into the absorption wafer.

11. The system of claim 1, wherein the at least one clusters of solar cells are selected from a group consisting of pentagonal, hexagonal, hexagonal pyramid, 3D polygon shaped, or combinations thereof.

12. The three-dimensional photovoltaic module of claim 1, wherein the 3D polygon solar frame is made of a plurality of sections having a hexagonal pyramid configuration.

13. The system of claim 1, wherein the one or more clusters of solar cells are arranged in a cluster of six triangular solar cells.

14. The system of claim 1, wherein the one or more clusters of solar cells are arranged in a cluster of four triangular solar cells.

15. The system of claim 1, wherein at least one of the one or more clusters is an upward facing hexagonal pyramid and at least one of the one or more clusters is a downward facing hexagonal pyramid.

* * * * *